United States Patent
Katti

(10) Patent No.: US 8,339,843 B2
(45) Date of Patent: Dec. 25, 2012

(54) GENERATING A TEMPERATURE-COMPENSATED WRITE CURRENT FOR A MAGNETIC MEMORY CELL

(75) Inventor: Romney R. Katti, Shorewood, MN (US)

(73) Assignee: Honeywell International Inc., Morristown, NJ (US)

( * ) Notice: Subject to any disclaimer, the term of this patent is extended or adjusted under 35 U.S.C. 154(b) by 186 days.

(21) Appl. No.: 12/971,244

(22) Filed: Dec. 17, 2010

(65) Prior Publication Data

US 2012/0155155 A1 Jun. 21, 2012

(51) Int. Cl.
*G11C 11/00* (2006.01)

(52) U.S. Cl. ........ 365/158; 365/148; 365/163; 365/171; 365/211

(58) Field of Classification Search .................... 365/211
See application file for complete search history.

(56) References Cited

U.S. PATENT DOCUMENTS

| | | | |
|---|---|---|---|
| 6,373,768 B2 * | 4/2002 | Woo et al. ..................... 365/211 |
| 6,531,723 B1 | 3/2003 | Engel et al. |
| 6,545,906 B1 | 4/2003 | Savtchenko et al. |
| 6,577,549 B1 | 6/2003 | Tran et al. |
| 6,608,790 B2 | 8/2003 | Tran et al. |
| 6,643,192 B2 * | 11/2003 | Marotta et al. ........... 365/189.09 |
| 6,661,724 B1 * | 12/2003 | Snyder et al. ................. 365/211 |
| 6,687,178 B1 | 2/2004 | Qi et al. |
| 6,775,196 B2 | 8/2004 | Perner et al. |
| 6,781,907 B2 | 8/2004 | Marr |
| 6,868,025 B2 | 3/2005 | Hsu |
| 6,885,602 B2 | 4/2005 | Cho et al. |
| 6,934,209 B2 | 8/2005 | Marr |
| 6,967,884 B2 | 11/2005 | Hsu |
| 6,982,916 B2 | 1/2006 | Tsang |
| 7,027,325 B2 | 4/2006 | Iwata |
| 2006/0001994 A1 | 1/2006 | Williams |
| 2009/0097303 A1 | 4/2009 | Katti |
| 2009/0201018 A1 | 8/2009 | Guo et al. |

OTHER PUBLICATIONS

"MRAM Technical Guide", 2007, downloaded from http://www.electrongate.com/dmxfiles/BRMRAMTECHGUIDE.pdf on Nov. 12, 2010, 4 pages.

* cited by examiner

*Primary Examiner* — Tan T. Nguyen
(74) *Attorney, Agent, or Firm* — Shumaker & Sieffert, P.A.

(57) ABSTRACT

This disclosure describes write current temperature compensation techniques for use in programming a data storage device that includes one or more memory cells. The techniques may include programming a programmable magnetization state of a magnetoresistive device included within a resistance network based on a signal indicative of the operating temperature of a magnetic memory cell. The techniques may further include generating a write current having a magnitude that is determined at least in part by the programmable magnetization state of the magnetoresistive device. The techniques may further include supplying the write current to the magnetic memory cell for programming a programmable magnetization state of the magnetic memory cell.

20 Claims, 14 Drawing Sheets

US 8,339,843 B2

GENERATING A TEMPERATURE-COMPENSATED WRITE CURRENT FOR A MAGNETIC MEMORY CELL

This disclosure relates to a current source, and more particularly, to a write current source for a magnetic memory cell.

BACKGROUND

Magnetoresistive Random Access Memory (MRAM) devices may include a plurality of magnetoresistive devices each of which forms a memory cell configured to store a single binary bit. Each of the magnetoresistive devices may be programmed to one of two different magnetization states in order to store the binary bit. In some MRAM devices, a magnetic field may be applied to the magnetoresistive device to program the magnetization state of the device. To apply the magnetic field, the MRAM device may cause one or more write currents to flow through conductors proximate to the magnetoresistive device that is being programmed. Each write current induces a magnetic field to flow around the current-carrying conductor in which the write current flows. If the combined magnetic field generated by the one or more write currents is of sufficient strength, then such a magnetic field may cause the magnetic moment of a free layer within the magnetoresistive device to align with the applied magnetic field thereby programming the magnetization state of the magnetoresistive device. The amount of write current required to generate a magnetic field strong enough to program the magnetization state of a magnetoresistive device may vary with the operating temperature of the MRAM device.

SUMMARY

This disclosure is directed to write current temperature compensation techniques for use in programming a data storage device that includes one or more memory cells. The techniques may include varying the resistance of a resistance network within a write current source based on a signal indicative of the operating temperature of the one or more memory cells. In some examples, the resistance network may include one or more magnetoresistive devices each having a programmable magnetization state. In such examples, the resistance of the resistance network may be varied by programming the magnetization states of each of the magnetoresistive devices based on the signal indicative of the operating temperature of the one or more magnetic memory cells. Programming the magnetization states of the one or more magnetoresistive device may cause the resistance network to produce a temperature-dependent resistance that varies according to a resistance-temperature function that includes at least one discontinuity.

According to one example, a device includes a magnetic memory cell having a programmable magnetization state. The device further includes a write current source comprising a resistance network that includes a magnetoresistive device having a programmable magnetization state. The write current source is configured to generate a write current having a magnitude that is determined at least in part by the programmable magnetization state of the magnetoresistive device. The write current source is further configured to supply the write current to the magnetic memory cell for programming the programmable magnetization state of the magnetic memory cell. The device further includes a control module configured to program the programmable magnetization state of the magnetoresistive device based on a signal indicative of the operating temperature of the magnetic memory cell.

According to another example, a method includes programming a programmable magnetization state of a magnetoresistive device included within a resistance network based on a signal indicative of the operating temperature of a magnetic memory cell. The method further includes generating a write current having a magnitude that is determined at least in part by the programmable magnetization state of the magnetoresistive device. The method further includes supplying the write current to the magnetic memory cell for programming a programmable magnetization state of the magnetic memory cell.

According to another example, an apparatus includes means for programming a programmable magnetization state of a magnetoresistive device included within a resistance network based on a signal indicative of the operating temperature of a magnetic memory cell. The apparatus further includes means for generating a write current having a magnitude that is determined at least in part by the programmable magnetization state of the magnetoresistive device. The apparatus further includes means for supplying the write current to the magnetic memory cell for programming a programmable magnetization state of the magnetic memory cell.

The details of one or more examples are set forth in the accompanying drawings and the description below. Other features, objects, and advantages will be apparent from the description and drawings, and from the claims.

DETAILED DESCRIPTION

This disclosure is directed to write current temperature compensation techniques for use in programming a data storage device that includes one or more memory cells. At lower temperatures, an MRAM memory cell may require a boost in write current to be able to successfully write to the cell. The temperature compensation techniques in this disclosure provide a resistance network that produces a temperature-dependent resistance that varies according to a resistance-temperature function. The resistance-temperature function may be configured to provide a boost in the write current magnitude at lower temperatures while maintaining acceptable levels of write current at higher temperatures.

The techniques may include varying the resistance of a resistance network within a write current source based on a signal indicative of the operating temperature of the one or more memory cells. In some examples, the resistance network may include one or more magnetoresistive devices each having a programmable magnetization state. In such examples, the resistance of the resistance network may be varied by programming the magnetization states of each of the magnetoresistive devices based on the signal indicative of the operating temperature of the one or more magnetic memory cells. Programming the magnetization states of the one or more magnetoresistive device may cause the resistance network to produce a temperature-dependent resistance that varies according to a resistance-temperature function that includes at least one discontinuity.

In further examples, the resistance network may include two or more resistances that are electrically coupled to each other in parallel. The two parallel resistances may cause the resistance network to produce a temperature-dependent resistance that varies according to a non-linear resistance-temperature function.

In additional examples, the resistance network may produce a temperature-dependent resistance that varies according to a non-linear resistance-temperature function that includes at least one discontinuity. For example, the resistance network may include two or more resistances electrically coupled in parallel with at least one of the resistances being a magnetoresistive device that is programmed based on the signal indicative of the operating temperature of the one or more magnetic memory cells. As another example, the resistance network may include a resistance electrically coupled in series with a sub-network of two or more resistances electrically coupled in parallel. One or more of the resistances may be a magnetoresistive device that is programmed based on a signal indicative of the operating temperature of the one or more magnetic memory cells.

Figure 1:
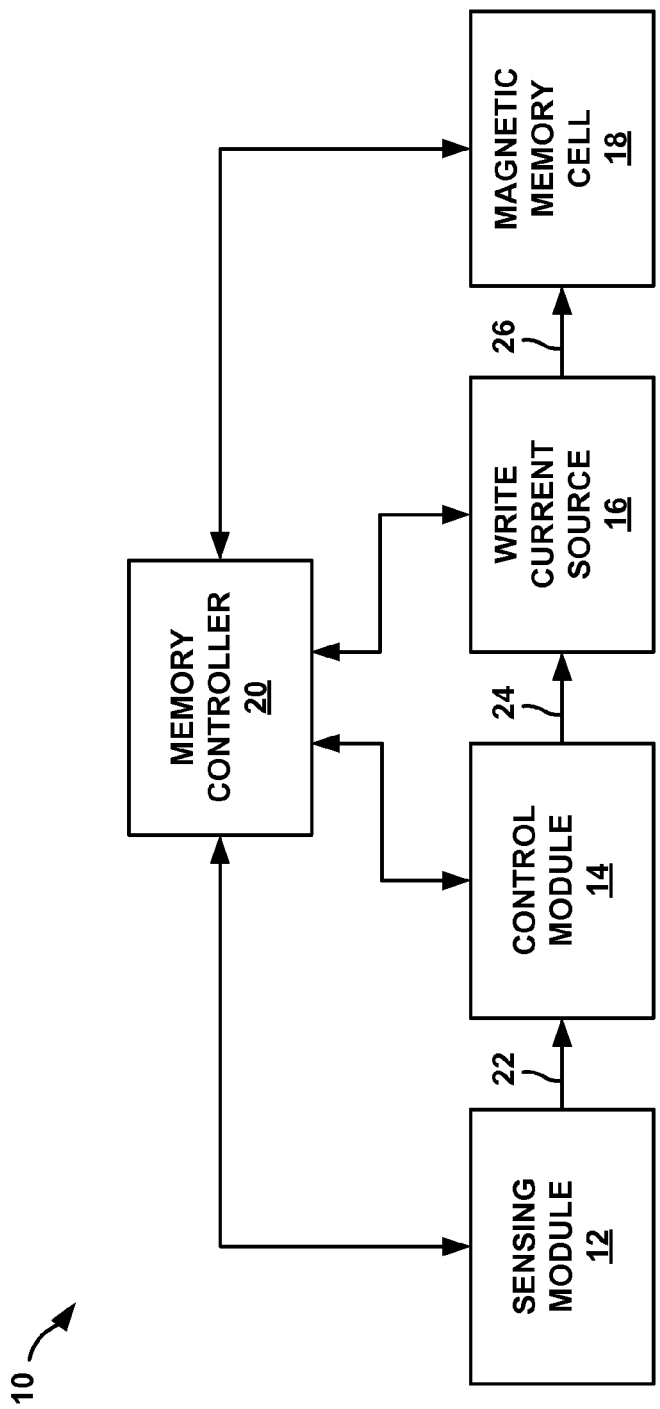
FIG. 1 is a block diagram illustrating an example data storage device according to this disclosure.

FIG. 1 is a block diagram illustrating an example data storage device 10 according to this disclosure. Data storage device 10 is configured to store and retrieve one or more bits of data for a host device. In some examples, data storage device 10 may form an MRAM device or a toggle-bit MRAM device. In further examples, data storage device 10 may be a device that includes an MRAM device, such as, e.g., a hard drive, a memory stick, and/or any device that includes an MRAM device. Data storage device 10 includes a sensing module 12, a control module 14, a write current source 16, a magnetic memory cell 18 and a memory controller 20.

Sensing module 12 is configured to generate a signal 22 indicative of the operating temperature of magnetic memory cell 18. Sensing module 12 is communicatively coupled to control module 14. In some examples, signal 22 may be a digital signal indicating whether the operating temperature of magnetic memory cell 18 is greater than a threshold operating temperature. In further examples, signal 22 may be an analog signal that is indicative of the temperature of magnetic memory cell 18. A signal indicative of the temperature of magnetic memory cell 18 may, in some examples, also be a signal indicative of the operating temperature of data storage device 10.

Sensing module 12 may include one or more sensors that are configured to generate signal 22. In some examples, sensing module 12 may contain one or more temperature sensors, such as, e.g., a thermometer, a thermistor, a thermocouple, a Resistance Temperature Detector (RTD), or any other sensor capable of detecting temperature. The one or more temperature sensors may be positioned anywhere within or proximate to data storage device 10.

In additional examples, sensing module 12 may be electrically coupled to a magnetoresistive device, and determine the magnitude of write current needed to switch the magnetization state of the magnetoresistive device at the current operating temperature. In such examples, the magnitude of the write current needed to switch the magnetization state of the magnetoresistive device at the current operating temperature may be indicative of the operating temperature of magnetic memory cell 18 and therefore may correspond to signal 22. For example, signal 22 may be a digital signal indicating whether the magnitude of write current needed to switch the magnetization state of the magnetoresistive device is greater than a threshold. As another example, signal 22 may be an analog signal indicative of the magnitude of write current needed to switch the magnetization state of the magnetoresistive device. The magnetoresistive device used for generating signal 22 may be a magnetoresistive device that is part of a memory containing magnetic memory cell 18 or may be separate from a memory containing magnetic memory cell 18, e.g., a "control" magnetoresistive device.

In some examples, sensing module 12 is communicatively coupled to memory controller 20. For example, sensing module 12 may provide feedback to memory controller 20 regarding the current operating temperature of data storage device 10 and/or the threshold operating temperature used for controlling the state of signal 22 when the signal is a digital signal.

The example data storage device 10 in FIG. 1 has been described as including a sensing module 12. However, in other examples, data storage device 10 may not include a sensing module. Instead, signal 22 may be provided by another device, such as, e.g., the host device that uses data storage device 10. The host device may include a computer, processor, embedded system, a personal digital assistant (PDA), a handheld device, and/or any other device that may use a data storage device for data storage.

Control module 14 is configured to control the magnitude of write current 26 generated by write current source 16 based on the signal 22 indicative of the operating temperature of magnetic memory cell 18. Write current source 16 includes a resistance network that includes one or more magnetoresistive devices each having a programmable magnetization state. Write current source 16 is configured to generate a write current 26 having a magnitude that is determined at least in part by the magnetization state of each of the one or more magnetoresistive devices within the resistance network. Thus, according to this disclosure, control module 14 may control the magnitude of write current 26 generated by write current source 16 by programming the respective magnetization states of the one or more magnetoresistive devices based on the signal 22 indicative of the operating temperature of magnetic memory cell 18.

Each of the one or more magnetoresistive devices within the resistance network of write current source 16 is configured to be programmed into one of two different magnetization states, and to vary a terminal-to-terminal resistance based on the programmed magnetization state of the magnetoresistive device. For example, each of the magnetoresistive devices may be programmed to operate in a parallel magnetization state or in an anti-parallel magnetization state. The magnetization state of a magnetoresistive device may be alternatively referred to herein as a resistance state of the magnetoresistive device. For example, if a magnetoresistive device is operating in a parallel magnetization state, then the magnetoresistive device may have a relatively low resistance between the terminals of the magnetoresistive device. Thus, the parallel magnetization state may be alternatively referred to herein as a "low resistance state." Similarly, if the magnetoresistive device is operating in an anti-parallel magnetization state, then the magnetoresistive device may have a relatively high resistance between the terminals of magnetoresistive device. As such, the anti-parallel magnetization state may be alternatively referred to herein as a "high resistance state." The terminal-to-terminal resistance of the magnetoresistive device may control the magnitude of current generated by write current source 16.

In some examples, each of the one or more magnetoresistive devices may include a free layer and a fixed layer. An intermediate layer may be positioned between the free layer and the fixed layer. The fixed layer may have a magnetic moment that is substantially fixed during normal operation of the device and the free layer may have a magnetic moment that is capable of being programmed. In further examples, the one or more magnetoresistive devices may include one or more magnetic tunnel junction (MTJ) magnetoresistive devices. In additional examples, the one or more magnetoresistive devices may include one or more giant magnetoresistance (GMR) devices. In yet further examples, the one or more magnetoresistive devices may include one or more toggle-bit magnetoresistive devices (e.g., one or more toggle-bit MRAM cells).

In examples where the resistance network of write current source 16 uses an MTJ or GMR magnetoresistive device, control module 14 may use one or more write currents 24 to inductively program the magnetoresistive device. For example, control module 14 may generate one or more write currents 24 having polarities (e.g., directions) that are determined by the magnetization state to be programmed. In such an example, control module 14 may generate one or more write currents 24 having respective first polarities to program the magnetoresistive device into the low resistance state. Similarly, control module 14 may generate one or more write currents 24 having respective second polarities to program the magnetoresistive device into the high resistance state. The first polarity for each write current 24 may be opposite the second polarity for the respective write current. Control module 14 may cause the one or more write currents 24 to flow through respective write current conductors associated with the magnetoresistive device to program the magnetization state of the magnetoresistive device.

In examples where the resistance network of write current source 16 uses a toggle-bit magnetoresistive device, control module 14 may initiate a toggle sequence to toggle the currently programmed magnetization state of the toggle-bit magnetoresistive device to a programmed magnetization state that is opposite the currently programmed magnetization state. For example, control module 14 may generate two write currents 24 that are timed according to a toggle sequence associated with the toggle-bit magnetoresistive device. If the toggle-bit magnetoresistive device is currently programmed in a high resistance state, control module 14 may initiate a toggle sequence to toggle the magnetization state from the high resistance state to a low resistance state. Similarly, if the toggle-bit magnetoresistive device is currently programmed in a low resistance state, control module 14 may initiate the same toggle sequence to toggle the magnetization state from the low resistance state to a high resistance state. Control module 14 may cause the two write currents 24 to flow through respective write current conductors according to a toggle sequence to program the magnetization state of the magnetoresistive device.

In some examples, a high resistance state for the resistance network may be defined for the case where each of the one or more magnetoresistive devices in the resistance network is programmed into a high resistance state. Similarly, a low resistance state for the resistance network may be defined for the case where each of the one or more magnetoresistive devices in the resistance network is programmed into a low resistance state. In such examples, control module 14 may switch the resistance network between a high resistance state and a low resistance state based on the signal 22 indicative of the operating temperature of the magnetic memory cell 18. Switching the resistance network into a high resistance state may involve programming each of the one or more magnetoresistive devices within the resistance network into a high resistance state. Similarly, switching the resistance network into a low resistance state may involve programming each of the one or more magnetoresistive devices within the network into a low resistance state.

In examples where signal 22 is a digital signal, control module 14 may switch the resistance network between the high resistance state and the low resistance state based on the value of the digital signal. In examples where signal 22 is an analog signal, control module 14 may compare the value of the analog signal to a threshold operating temperature, and switch the resistance network between the high resistance state and the low resistance state based on the comparison.

In further examples, the resistance network may include at least two magnetoresistive devices and at least three different resistance states may be defined for the resistance network based on the various combinations of resistance states to which the magnetoresistive devices can be programmed. In such examples, data storage device 10 may use multiple operating temperature thresholds to perform temperature-based write current compensation.

In some examples, write current source 16 may take the form of a current-mirror circuit having an input current leg and an output current leg. The resistance of the resistance network may be configured to control the magnitude of current flowing through the input current leg of the current mirror.

In examples where magnetic memory cell 18 is an MTJ or GMR magnetoresistive device, write current source 16 may generate the write current 26 to have either a first direction or a second direction depending on the data to be written to magnetic memory cell 18. For example, if the data to be written to magnetic memory cell 18 is a binary zero, then write current source 16 may generate a write current 26 having a first direction or polarity, which may cause magnetic memory cell 18 to be programmed into a first magnetization state. Similarly, if the data to be written to magnetic memory cell 18 is a binary one, then write current source 16 may generate a write current 26 having a second direction or polarity, which may cause magnetic memory cell 18 to be programmed into a second magnetization state.

In examples where magnetic memory cell 18 is a toggle-bit magnetoresistive device, write current source 16 may generate two write currents 26 according to a toggle sequence that is configured to toggle the magnetization state of magnetic memory cell 18. In such examples, memory controller 20 may direct write current source 16 to perform the toggle sequence only when the memory controller 20 determines that the magnetization state of magnetic memory cell 18 is different than the magnetization state corresponding to the bit to be written to magnetic memory cell 18.

In some examples, control module 14 may be communicatively coupled to memory controller 20. For example, control module 14 may provide feedback to memory controller 20 regarding the current operating state of the resistance network in write current source 16 and/or the threshold operating temperature used for controlling the operating state of write current source 16 when the signal 22 is an analog signal. Write current source 16, in some examples, may be communicatively and/or operatively coupled to memory controller 20. For example, memory controller 20 may control write current source 16 to write a particular bit of data to magnetic memory cell 18.

Magnetic memory cell 18 may be configured to store a bit of data as a magnetization state. Magnetic memory cell 18 may be part of a memory that includes a plurality of magnetic memory cells. Each of the magnetic memory cells may include a magnetoresistive device that is configured to be programmed into one of two different magnetization states, and to vary a terminal-to-terminal resistance based on the programmed magnetization state of the magnetoresistive device. The programmed magnetization state may correspond to the binary bit which the magnetic memory cell is storing. Any of the magnetoresistive devices described above with respect to the resistance network in write current source 16 may be used in magnetic memory cell 18. For example, the magnetoresistive device in magnetic memory cell 18 may be an MTJ magnetoresistive device, a GMR magnetoresistive device, and/or a toggle-bit magnetoresistive device (e.g., a toggle-bit MRAM cell).

The magnetoresistive device used for the resistance network in write current source 16 may be the same as or different from the magnetoresistive device used for magnetic memory cell 18. In some examples, the magnetoresistive device used for both the resistance network in write current source 16 and magnetic memory cell 18 may be a toggle-bit magnetoresistive device. In additional examples, the magnetoresistive device used for magnetic memory cell 18 may be a toggle-bit magnetoresistive device and the magnetoresistive device used for the resistance network in write current source 16 may be a MTJ magnetoresistive device. Other examples are also contemplated.

Magnetic memory cell 18 may be communicatively coupled to memory controller 20. For example, magnetic memory cell 18 may provide status information to memory controller 20 related to the execution of read and write commands.

Memory controller 20 may be configured to control the operation of data storage device 10. For example, memory controller 20 may be configured to execute write operations initiated by a host device to write data to magnetic memory cell 18. In additional examples, memory controller 20 may also be configured to execute read operations initiated by the host device to magnetic memory cell 18. In further examples, memory controller 20 may be configured to program the threshold operating temperature used to generate the temperature compensated write currents.

In examples where magnetic memory cell 18 includes a toggle-bit magnetoresistive device, memory controller 20 may be configured to determine whether magnetic memory cell 18 needs to be toggled as part of a write operation. For example, in response to receiving a write instruction from a host controller that instructs memory controller 20 to write data to magnetic memory cell 18, memory controller 18 may determine the current state of magnetic memory cell 18. If the current state of magnetic memory cell 18 matches the data to be written to magnetic memory cell 18, memory controller 20 may determine that magnetic memory cell 18 does not need to be toggled as part of the write operation. On the other hand, if the current state of magnetic memory cell 18 does not match the data to be written to magnetic memory cell 18, memory controller 20 may determine that magnetic memory cell 18 does need to be toggled as part of the write operation.

In the example data storage device 10 of FIG. 1, memory controller 20 is communicatively coupled to sensing module 12, control module 14, write current source 16, and magnetic memory cell 18. However, in other example data storage devices, one or more of sensing module 12, control module 14, write current source 16, and magnetic memory cell 18 may not be communicatively coupled to memory controller 20.

The operation of data storage device 10 will now be described in the case where the device operating temperature is initially greater than the threshold operating temperature, and then decreases from a temperature greater than a threshold operating temperature to a temperature less than the threshold operating temperature. Because the device operating temperature is initially greater than the threshold operating temperature in this example, the magnetoresistive device within the resistance network of write current source 16 is initially configured to operate in a high resistance state. In some examples, the threshold operating temperature may correspond to a temperature where the magnitude of write current needed to successfully write to magnetic memory cell 18 is higher than that which would be available if the resistance network continued to operate in the high resistance state.

When the operating temperature decreases to a temperature less than the threshold operating temperature, sensing module 12 generates a signal 22 indicating that the operating temperature of magnetic memory cell 18 is below the threshold operating temperature. In response to the signal 22 indicating that the operating temperature of magnetic memory cell 18 is below the threshold operating temperature, control module 14 programs the magnetization state of the magnetoresistive device within write current source 16 to a low resistance state.

Write current source 16 generates a write current 26 having a magnitude that is determined at least in part by the low resistance state of the magnetoresistive device within write current source 16. In particular, the low resistance state of the magnetoresistive device causes write current 26 to have a magnitude greater than the magnitude of the write current which would have been generated had the magnetoresistive continued to have operated in the high resistance state. Write current source 16 supplies write current 26 to magnetic memory cell 18 for programming the programmable magnetization state of the magnetic memory cell 18.

If the magnetoresistive device were to have continued to operate in the high resistance state at temperatures below the threshold operating temperature, the magnitude of write current generated by write current source 16 might have been low enough to cause write errors. In this case, by switching the resistance state of the magnetoresistive device in the resistance network of write current source 16 to a low resistance state at temperatures below the threshold operating temperature, the magnitude of write current may be increased to a level that is capable of writing to magnetic memory cell 18 such that the occurrence of write errors is reduced.

When the device operating temperature increases back to a temperature that is greater than the threshold operating temperature, sensing module 12 generates a signal 22 indicating that the operating temperature of magnetic memory cell 18 is greater than the threshold operating temperature. In response to the signal 22 indicating that the operating temperature of magnetic memory cell 18 is greater than the threshold operating temperature, control module 14 programs the magnetization state of the magnetoresistive device within write current source 16 to a high resistance state.

Write current source 16 generates a write current 26 having a magnitude that is determined at least in part by the high resistance state of the magnetoresistive device within write current source 16. In particular, the high resistance state of the magnetoresistive device causes write current 26 to have a magnitude less than the magnitude of the write current which would have been generated had the magnetoresistive device continued to have operated in the low resistance state. Write current source 16 supplies write current 26 to magnetic memory cell 18 for programming the programmable magnetization state of the magnetic memory cell 18.

If the magnetoresistive device were to have continued to operate in the low resistance state at temperatures above the threshold operating temperature, the magnitude of write current generated by write current source 16 might have been high enough to cause write errors or reduce conductor life. Therefore, by switching the resistance state of the magnetoresistive device in the resistance network of write current source 16 to a high resistance state at temperatures above the threshold operating temperature, the magnitude of write current may be decreased to a level that is capable of writing to magnetic memory cell 18, but avoids write errors and reducing lifetime.

The operation of data storage device 10 was described above with respect to an example resistance network that included a single magnetoresistive device. However, in other examples, the resistance network of data storage device 10 may include multiple magnetoresistive devices. In such examples, control module 14 may be configured, in some examples, to switch each of the magnetoresistive devices to the low resistance state when the device operating temperature decreases below the threshold operating temperature, and to switch each of the magnetoresistive devices to the high resistance state when the device operating temperature increases the threshold operating temperature. In further examples, control module 14 may switch the magnetoresistive devices to three or more different sets of magnetization states based on two or more different threshold operating temperatures.

According to this disclosure, magnetic memory cell 18 may have a programmable magnetization state. Write current source 16 may include a resistance network that includes a magnetoresistive device having a programmable magnetization state. Write current source 16 may be configured to generate a write current having a magnitude that is determined at least in part by the programmable magnetization state of the magnetoresistive device, and to supply the write current to magnetic memory cell 18 for programming the programmable magnetization state of magnetic memory cell 18. Control module 14 may be configured to program the programmable magnetization state of the magnetoresistive device based on a signal indicative of the operating temperature of the magnetic memory cell.

In some examples, control module 14 may be further configured to switch the magnetization state of the magnetoresistive device based on the signal indicative of the operating temperature of magnetic memory cell 18 to cause the resistance network to produce a temperature-dependent resistance between a first terminal and a second terminal of the resistance network that varies according to a resistance-temperature function that includes at least one discontinuity. In such examples, write current source 16 may be further configured to generate the write current such that the magnitude of the write current is determined at least in part by the temperature-dependent resistance of the resistance network. In further examples, the resistance network may be configured to cause the resistance-temperature function to be a non-linear function that includes the at least one discontinuity.

In some example, the resistance network may include a first resistance electrically coupled in parallel to the magnetoresistive device. In such examples, the first resistance and the magnetoresistive device may form a parallel resistance sub-network, and the resistance network may further include, in some examples, a second resistance electrically coupled in series to the parallel resistance sub-network. In further examples, the resistance network may include a first resistance and a second resistance electrically coupled in parallel to the first resistance, the first and second resistances forming a parallel resistance sub-network, and a magnetoresistive device may be electrically coupled in series with the parallel resistance sub-network.

In further examples, write current source 16 may include a first transistor comprising a base terminal and a drain terminal, the base terminal of the first transistor being electrically coupled to the drain terminal of the first transistor, and the drain terminal of the first transistor being electrically coupled to the resistance network. In such examples, write current source 16 may further include a second transistor comprising a base terminal and a drain terminal, the base terminal of the second transistor being electrically coupled to the base terminal of the first transistor, the drain terminal of the second transistor being electrically coupled to a magnetic memory cell and configured to provide a write current to the magnetic memory cell.

In the example data storage device 10 of FIG. 1, sensing module 12, control module 14, and write current source 16 have been described as separate modules for ease of understanding of this disclosure. However, in other examples, one or more of sensing module 12, control module 14, and write current source 16 may be combined into a single module. For example, in some examples, control module 14 may be included within sensing module 12 and/or write current source 16. In additional examples, both sensing module 12 and control module 14 may be included within write current source 16.

Figure 2:
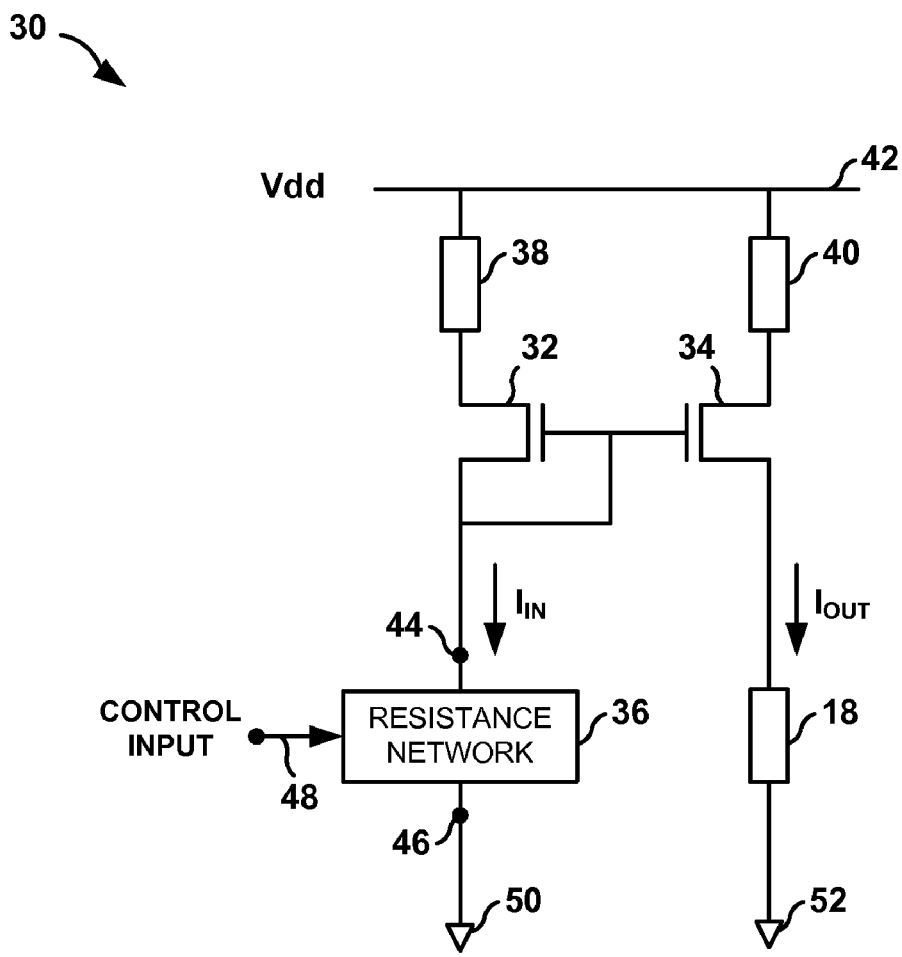
FIG. 2 is schematic diagram illustrating an example write current source according to this disclosure.

FIG. 2 is schematic diagram illustrating an example write current source 30 according to this disclosure. In some examples, write current source 30 may correspond to write current source 16 described above with respect to FIG. 1.

Write current source includes transistors 32, 34, resistance network 36, resistances 38, 40, power rail 42, and ground terminals 44, 46.

Transistors 32 and 34 each include a source terminal, a drain terminal, and a base terminal. The source terminal of transistor 32 is electrically coupled to a first terminal of resistance 38. The drain terminal of transistor 32 is electrically coupled to terminal 44 of resistance network 36, to the base terminal of transistor 32, and to the base terminal of transistor 34. The base terminal of transistor 32 is electrically coupled to terminal 44 of resistance network 36, to the drain terminal of transistor 32, and to the base terminal of transistor 34.

The source terminal of transistor 34 is electrically coupled to a first terminal of resistance 40. The drain terminal of transistor 34 is electrically coupled to magnetic memory cell 18. The base terminal of transistor 34 is electrically coupled to terminal 44 of resistance network 36, to the base terminal of transistor 32, and to the drain terminal of transistor 32.

Figure 3:
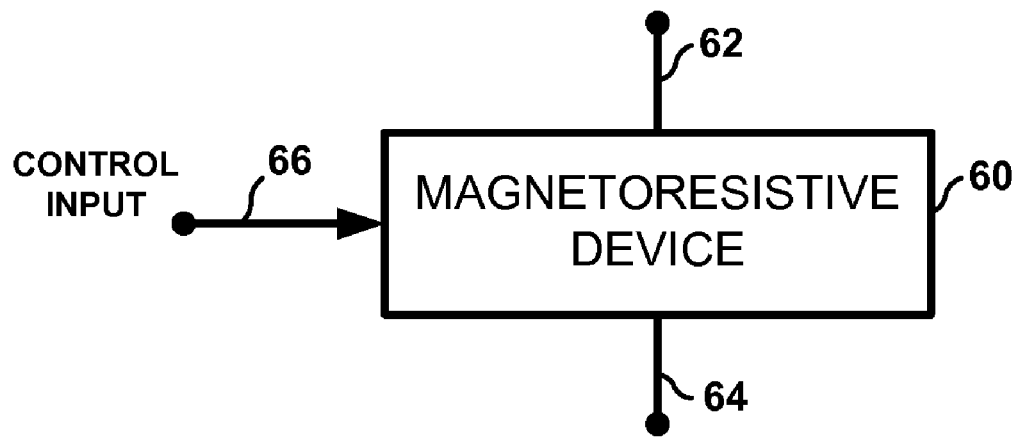
FIG. 3 is a block diagram illustrating an example magnetoresistive device according to this disclosure.

Transistors 32 and 34 may be implemented as metal-oxide-semiconductor (MOS) transistors. It should be noted, however, that bipolar junction transistors (BJTs) may be substituted for one or more of the MOS transistors. In such cases, it is understood that, when this disclosure refers to the gate terminal of a MOS transistor, the disclosure may also be referring to the base terminal of a BJT. Similarly, when the disclosure refers to the source terminal or the drain terminal of a MOS transistor, the disclosure may also be referring to the emitter terminal or the collector terminal of a BJT respectively. In addition, the example write current source 30 illustrated in FIG. 3, illustrates a current mirror configuration utilizing pMOS transistors (or alternatively pnp-BJTs) that have source terminals electrically coupled to a Vdd power rail. However, the techniques may also be applied in a current mirror configuration utilizing nMOS transistors (or alternatively npn-BJTs) that have source terminals electrically coupled to a low voltage power rail (e.g., a ground power rail).

Resistance 38 includes a first terminal that is electrically coupled to the source terminal of transistor 32 and a second terminal that is electrically coupled to power rail 42. Resistance 40 includes a first terminal that is electrically coupled to the source terminal of transistor 34 and a second terminal that is electrically coupled to power rail 42. Although write current source 30 is illustrated in FIG. 2 as including source resistances 38 and 40, in other examples, a current mirror configuration may be designed for write current source 30 that does not include one or both of resistances 38 and 40.

Resistance network 36 includes a first terminal 44 that is electrically coupled to the drain terminal of transistor 32 and a second terminal 46 that is electrically coupled to a ground node 48. Magnetic memory element 18 is modeled as a resistance in FIG. 2 and includes a first terminal that is electrically coupled to the drain of transistor 34 and a second terminal that is electrically coupled to ground node 52.

Resistance 38, transistor 32 and resistance network 36 may form an input leg of a current mirror. Resistance 40 and transistor 34 may form an output leg of the current mirror. The current flowing through the input leg of the current mirror ($I_{IN}$) may be defined as one of the following: (1) the current flowing into resistance network 36 via terminal 44; (2) the current flowing out of resistance network 36 via terminal 46; or (3) the current flowing through resistance network 36 from terminal 44 to terminal 46. The current flowing through the output leg of the current mirror ($I_{OUT}$) may be defined as the current flowing out of the drain of transistor 34 and into the write line of magnetic memory cell 18. The current mirror may be configured to regulate the magnitude of the current flowing through the output leg and into magnetic memory cell 18 based on the magnitude of current flowing through the input current leg. In some examples, the current mirror may regulate the magnitude of current flowing through the output leg such that the magnitude is substantially equal to the magnitude of current flowing through the input leg. In further examples, the current mirror may regulate the magnitude of current flowing through the output leg such that the magnitude is substantially equal to the magnitude of current flowing through the input leg multiplied by a constant factor.

The magnitude of current flowing through the input current leg is controlled by the resistance between terminals 44 and 46 of resistance network 36. In general, as the resistance between terminals 44 and 46 of resistance network 36 increases, the current flowing into and out of resistance network 36 decreases. Similarly, as the resistance between terminals 44 and 46 of resistance network 36 decreases, the current flowing into and out of resistance network 36 increases.

Resistance network 36 may be configured to produce a temperature-dependent resistance between terminals 44 and 46 that varies according to a resistance-temperature function. In some examples, a control signal produced by a control unit may cause the resistance-temperature function to include at least one discontinuity. In such examples, resistance network 36 includes one or more magnetoresistive devices each having a programmable magnetization state. As shown in FIG. 2, resistance network 36 includes a control input 48 that is used to control the programmable magnetization states of the one or more magnetoresistive devices. Control input 48 may be generated by a device that is configured to switch the magnetization state of one or more magnetoresistive devices within resistance network based on a signal indicative of the operating temperature of magnetic memory cell 18. In some examples, the control signal may be generated by control module 14 as described above with respect to FIG. 1 and control input 48 may correspond to the one or more write currents 24 as described above with respect to FIG. 1.

During operation, write current source 30 generates a write current ($I_{OUT}$) having a magnitude that is determined at least in part by the resistance between terminals 44 and 46 of resistance network 36. The resistance between terminals 44 and 46 of resistance network 36 may be determined at least in part by the programmable magnetization states of one or more magnetoresistive devices contained within resistance network 36. As such, write current source 30 is configured to generate a write current having a magnitude that is determined at least in part by the programmable magnetization state of the one or more magnetoresistive devices contained within resistance network 36. Write current source 30 supplies the write current to magnetic memory cell 18 for programming the programmable magnetization state of magnetic memory cell 18.

In further examples, the configuration of resistances within resistance network 36 may cause resistance network 36 to produce a temperature-dependent resistance between terminals 44 and 46 that varies according to a non-linear resistance-temperature function. In such examples, resistance network 36 may be configured to include at least two resistances electrically coupled to each other in parallel to form a parallel resistance sub-network. In some implementations of this example, one or more of the resistances in the parallel resistance sub-network may be a magnetoresistive device. In such implementations, the non-linear resistance-temperature function produced by resistance network 36 may include at least one discontinuity. In other implementations of this example, the resistances in the parallel resistance sub-network may not include any switchable magnetoresistive devices. In such implementations, the non-linear resistance-temperature function produced by resistance network 36 may be continuous (i.e., the function does not include any points of discontinuity).

FIG. 3 is a block diagram illustrating an example magnetoresistive device 60 according to this disclosure. Magnetoresistive device 60 includes terminals 62, 64 and control input 66. Magnetoresistive 60 device is configured to vary the resistance between terminals 62, 64 based on a magnetization state of magnetoresistive device 60. Control input 66 may be used to program the magnetization state of magnetoresistive device 60.

Magnetoresistive device 60 may be used to implement any of the magnetoresistive devices of this disclosure. For example, magnetoresistive device 60 may be used to implement one or more magnetoresistive devices in the resistance network included within write current source 16 of FIG. 1, one or more magnetoresistive devices included within resistance network 36 of FIG. 2, and/or one or more magnetoresistive devices included within magnetic memory cell 18.

In some examples, resistance network 36 of FIG. 2 may be implemented as a single magnetoresistive device. In such examples, magnetoresistive device 60 may correspond to resistance network 36, terminal 62 of magnetoresistive device 60 may correspond to terminal 44 of resistance network 36, terminal 64 of magnetoresistive device 60 may correspond to terminal 46 of resistance network 36, and control input 66 may correspond to control input 48 of resistance network 36.

Magnetoresistive device 60 may include a free layer and a fixed layer. An intermediate layer may be positioned between the free layer and the fixed layer. The fixed layer may have a magnetic moment that is substantially fixed during normal operation of the device and the free layer may have a magnetic moment that is capable of being programmed. In further examples, the one or more magnetoresistive devices may include one or more MTJ magnetoresistive devices. In additional examples, the one or more magnetoresistive devices may include one or more GMR magnetoresistive devices. In yet further examples, the one or more magnetoresistive devices may include one or more toggle-bit magnetoresistive devices (e.g., one or more toggle-bit MRAM cells).

Control input 66 is configured to program the magnetization state or resistance state of magnetoresistive device 60. In some examples, magnetoresistive device 60 may be configured to be inductively programmed. In such examples, control input 66 may correspond to one or more write lines that are located proximate to the free layer of magnetoresistive device 60. The one or more write lines may be configured to induce a magnetic field within the free layer in order to adjust the magnetic moment of free layer. In such examples, the control signal received via control input 66 may include write currents that flow through the write lines.

In examples where magnetoresistive device 60 is a MTJ or GMR magnetoresistive device, the polarity or direction of the write currents may determine the resulting magnetic moment of the free layer, and hence the resulting magnetization state of magnetoresistive device 60. In examples where magnetoresistive device 60 is a toggle-bit magnetoresistive device, a toggle sequence of write currents may toggle or reverse the magnetization state of magnetoresistive device 60.

In further examples, magnetoresistive resistive device 60 may be configured to be programmed with a spin-polarized current. In such examples, control input 66 may correspond to one or more write lines that are configured to inject the spin polarized current into the free layer of magnetoresistive device 60. The spin direction of the spin polarized current adjusts the magnetic moment of free layer. In such examples, the control signal received via control input 66 may include one or more spin-polarized write currents.

In examples where magnetoresistive device 60 is used within a resistance network of a write current source, a control module (e.g., control module 14 of FIG. 1) may be used to generate one or more write currents at control input 66 to adjust the magnetization state of magnetoresistive device 60 based on a signal indicative of the operating temperature of a magnetic memory cell. In examples where magnetoresistive device 60 is used within a magnetic memory cell (e.g., magnetic memory cell 18 of FIG. 1), a write current source (e.g., write current source 16 of FIG. 1) may be used to generate one or more write currents at control input 66 to adjust the magnetization state of magnetoresistive device 60 based on the data to be written to the magnetic memory cell.

Figure 4A:
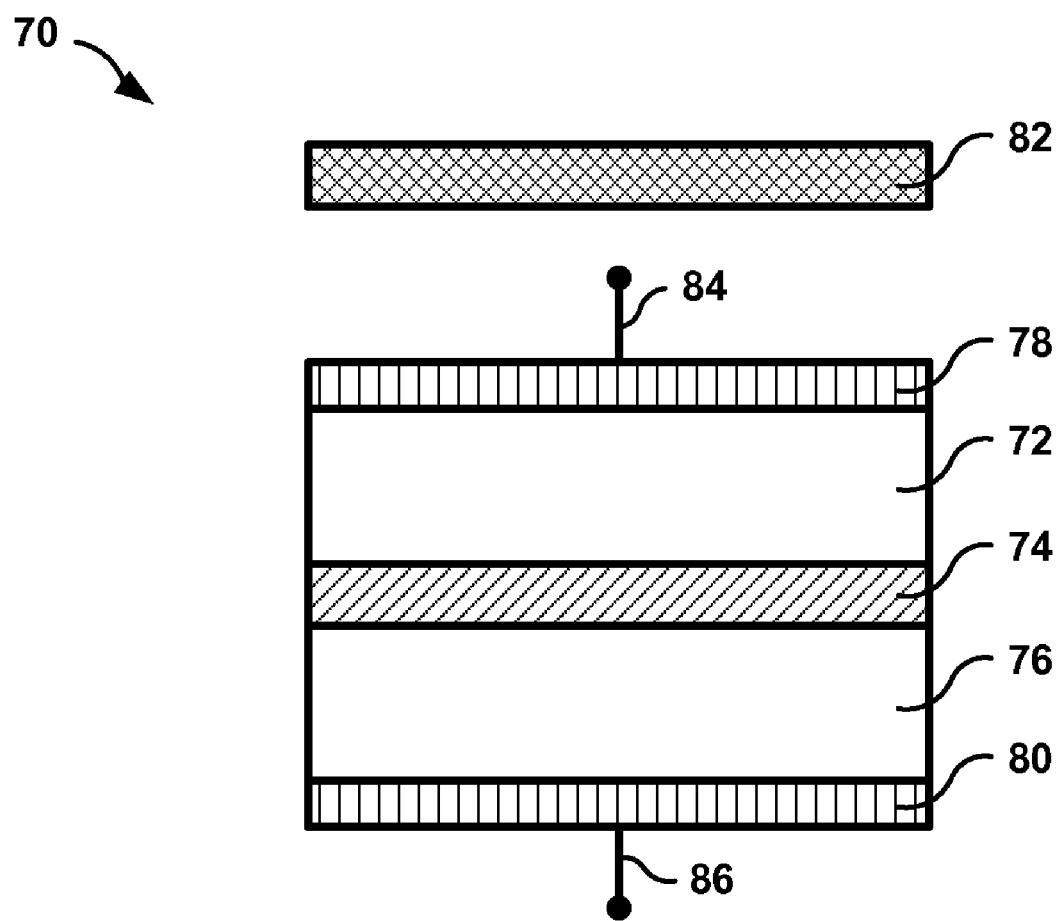
FIG. 4A is a conceptual diagram illustrating an example magnetoresistive device that may be used to implement the magnetoresistive device of FIG. 3 according to this disclosure.

FIG. 4A is a conceptual diagram illustrating an example magnetoresistive device 70 that may be used to implement magnetoresistive device 60 of FIG. 3 according to this disclosure. Magnetoresistive device 70 is configured to vary a terminal-to-terminal resistance based on a magnetization state of the magnetoresistive device. Magnetoresistive device 70 includes a free layer 72, an intermediate layer 74, a fixed layer 76, electrodes 78, 80, 82, and terminals 84, 86.

Free layer 72 includes ferromagnetic materials, such as, e.g., nickel (Ni), iron (Fe), cobalt (Co), binary and ternary alloys of Ni, Fe, and Co, permalloys, or any other material that has ferromagnetic properties. Fixed layer 76 includes ferromagnetic materials, such as, e.g., nickel, iron, cobalt, nickel alloys, iron alloys, cobalt alloys, permalloys, or any other material that has ferromagnetic properties. Antiferromagnetic materials may also be applied to free layer 72 and/or fixed layer 76, such as, e.g., iron manganese and other manganese alloys. In some examples, free layer 72 and fixed layer 76 may include thin-film ferromagnetic materials. Although free layer 72 and fixed layer 76 are described in the example magnetoresistive device 70 of FIG. 4A as including ferromagnetic materials, in other examples, one or more of free layer 72 and fixed layer 76 may include ferrimagnetic materials in addition to or in lieu of the ferromagnetic materials.

Free layer 72 is configured to have a magnetization direction that can be altered by the application of a magnetic field. Fixed layer 76 is configured to have a magnetization direction that is substantially fixed when the magnetic field is applied to free layer 72. Fixed layer 36 may alternatively be referred to as a pinned layer.

In order to achieve the desired behaviors for free layer 72 and fixed layer 76, a first type of ferromagnetic material may be selected for free layer 72, and a second type of ferromagnetic material may be selected for fixed layer 76. For example, the ferromagnetic material selected for fixed layer 76 may require a higher strength of magnetic field to alter the magnetization direction of the material than the strength of magnetic field required to alter the magnetization direction of free layer 72. As another example, the ferromagnetic material selected for fixed layer 76 may require a higher device temperature to alter the magnetization direction of the material than the device temperature required to alter the magnetization direction of free layer 72.

Intermediate layer 74 is disposed between free layer 72 and fixed layer 76. In some examples, magnetoresistive device 70 may take the form of a GMR magnetoresistive device. In such examples, intermediate layer 74 may be referred to as a non-ferromagnetic conductive layer or a non-ferromagnetic spacer layer. The non-ferromagnetic layer may include non-ferromagnetic conductor materials, such as, e.g., copper, chromium, aluminum, respective alloys of the preceding metals, or the like.

In additional examples, magnetoresistive device 70 may take the form of an MTJ magnetoresistive device and/or a tunneling magnetoresistance (TMR) device. In such examples, intermediate layer 34 may be referred to as an insulating layer or a tunnel barrier layer. The insulating layer may include insulating materials, such as, e.g., aluminum oxide, magnesium oxide, other types of oxides, a nitride, or any other material having insulating properties.

The multi-layer structure formed by free layer 72, intermediate layer 74 and fixed layer 76 may be disposed between electrodes 78, 80. As shown in FIG. 4A, electrode 78 is proximate to free layer 72 and electrode 80 is proximate to fixed layer 76. In some examples, electrode 78 may be in direct contact with free layer 72 and electrode 80 may be in direct contact with fixed layer 76. Terminal 84 is electrically coupled to electrode 78, and terminal 86 is electrically coupled to electrode 80. As used herein, terminal 84 may be referred to as a "free layer terminal" and terminal 86 may be referred to as a "fixed layer terminal."

In examples where magnetoresistive device 70 is used to implement magnetoresistive device 60 illustrated in FIG. 3, terminal 84 of magnetoresistive device 70 may correspond, in some examples, to terminal 62 of magnetoresistive device 60 and terminal 86 of magnetoresistive device 70 may correspond to terminal 64 of magnetoresistive device 60. In further examples, terminal 86 of magnetoresistive device 70 may correspond to terminal 62 of magnetoresistive device 60 and terminal 84 of magnetoresistive device 70 may correspond to terminal 64 of magnetoresistive device 60.

As used herein, the magnetization state of magnetoresistive device 70 may refer to whether the device is configured in a parallel magnetization state or an anti-parallel magnetization state. The magnetization state of magnetoresistive device 70 is defined by the relative orientation of the magnetization directions of free layer 72 and fixed layer 76. The magnetization direction of each of free layer 72 and fixed layer 76 may refer to the direction of the magnetic moment of the ferromagnetic material for the respective layer. When the magnetization directions (i.e., magnetic moments) of free layer 72 and fixed layer 76 are aligned in the same direction, then magnetoresistive device 70 is said to be in a parallel magnetization state. When operating in the parallel magnetization state, the resistance between terminals 84 and 86 is relatively low. Thus, the parallel magnetization state may be referred to as a low resistance state. When the magnetization directions (i.e., magnetic moments) of free layer 72 and fixed layer 76 are oriented in opposite directions (i.e., not aligned in the same direction), then magnetoresistive device 70 is said to be in an anti-parallel magnetization state. When operating in the anti-parallel magnetization state, the resistance between terminals 84 and 86 is relatively high. Thus, the anti-parallel magnetization state may be referred to as a high resistance state.

Electrode 82 may form a write line electrode for magnetoresistive device 70. Electrode 82 may be configured to induce a magnetic field proximate to free layer 72 when a current is propagating through electrode 82. The magnetic field induced by the current propagating through electrode 82 may cause the magnetic moment of free layer 72 to align in a particular direction. The direction of the magnetic field may control the direction to which the magnetic moment in free layer 72 aligns. For example, a current propagating through conductor 82 in a first direction may induce a magnetic field within free layer 72 in a first direction, which causes the magnetic moment in free layer 72 to align in a first direction. Similarly, a current propagating through conductor 82 in a second direction may induce a magnetic field free layer 72 in a second direction, which causes the magnetic moment in free layer 72 to align in a second direction.

Electrode 82 may be positioned proximate to free layer 72. As shown in the example magnetoresistive device 70 of FIG. 4A, electrode 82 is positioned on a side of electrode 78 that is opposite that of the multi-layer structure formed by free layer 102, intermediate layer 104 and fixed layer 106. However, in further examples, electrode 82 may be positioned in any location where a magnetic field induced by a write current propagating through electrode 82 substantially overlaps with free layer 72. Electrode 82 may, in some examples, be electrically isolated from conductor 78 and/or free layer 72. For example, a dielectric may be applied to electrode 78, and electrode 82 may be formed on the side of the dielectric opposite that of electrode 78. In some examples, electrode 82 may correspond to control input 66 of magnetoresistive device 60 illustrated in FIG. 3. Although example magnetoresistive device 70 has been illustrated in FIG. 4A as including a single write line electrode 82, in other examples, a magnetoresistive device may include two or more write line electrodes. For example, a second write line electrode may be positioned proximate to fixed layer such that the multi-layer structure formed by free layer 72, intermediate layer 74 and fixed layer 76 is disposed between the two write line electrodes.

Figure 4B:
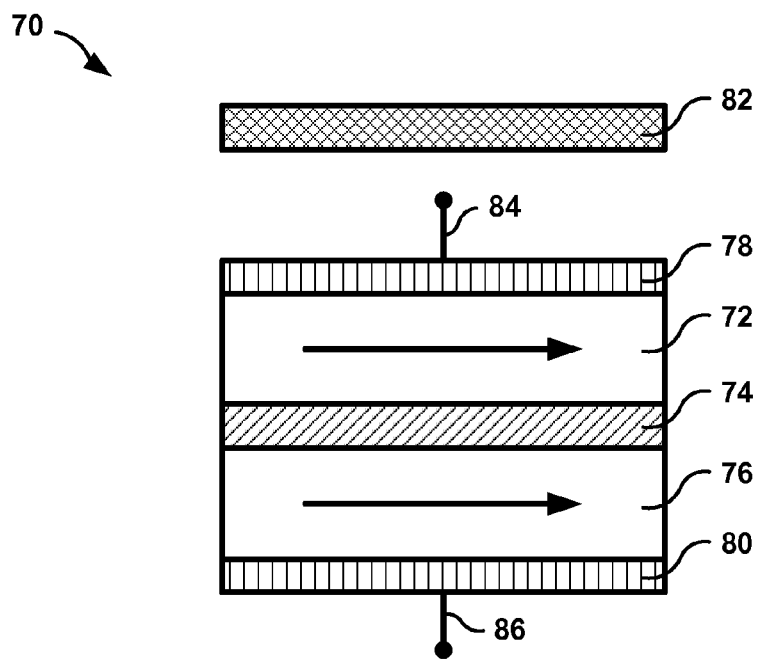
FIG. 4B is a conceptual diagram illustrating the example magnetoresistive device of FIG. 4A in a parallel magnetization state according to this disclosure.

FIG. 4B is a conceptual diagram illustrating the example magnetoresistive device 70 of FIG. 4A in a parallel magnetization state according to this disclosure. In FIG. 4B, free layer 72 and fixed layer 76 each have an arrow representative of the magnetization direction of the layers. As shown in FIG. 4B, the arrows point in the same direction representing that the magnetization direction of free layer 72 is the same as the magnetization direction of fixed layer 76, which means that the magnetoresistive device is in a parallel magnetization state.

Figure 4C:
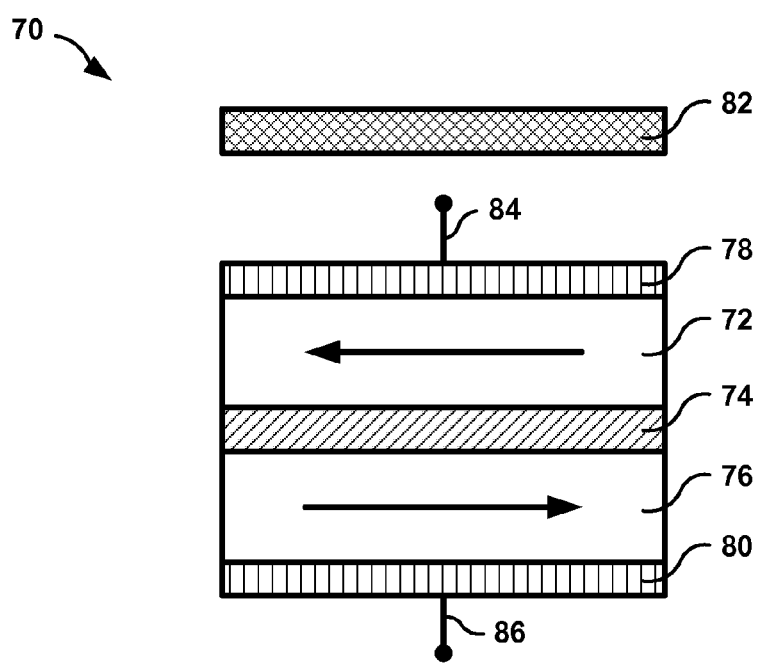
FIG. 4C is a conceptual diagram illustrating the example magnetoresistive device of FIG. 4A in an anti-parallel magnetization state according to this disclosure.

FIG. 4C is a conceptual diagram illustrating the example magnetoresistive device 70 of FIG. 4A in an anti-parallel magnetization state according to this disclosure. As shown in FIG. 4C, the arrows representative of the magnetization directions of the layers are oriented in opposite directions, which means that the magnetoresistive device is in an anti-parallel magnetization state.

Figure 5:
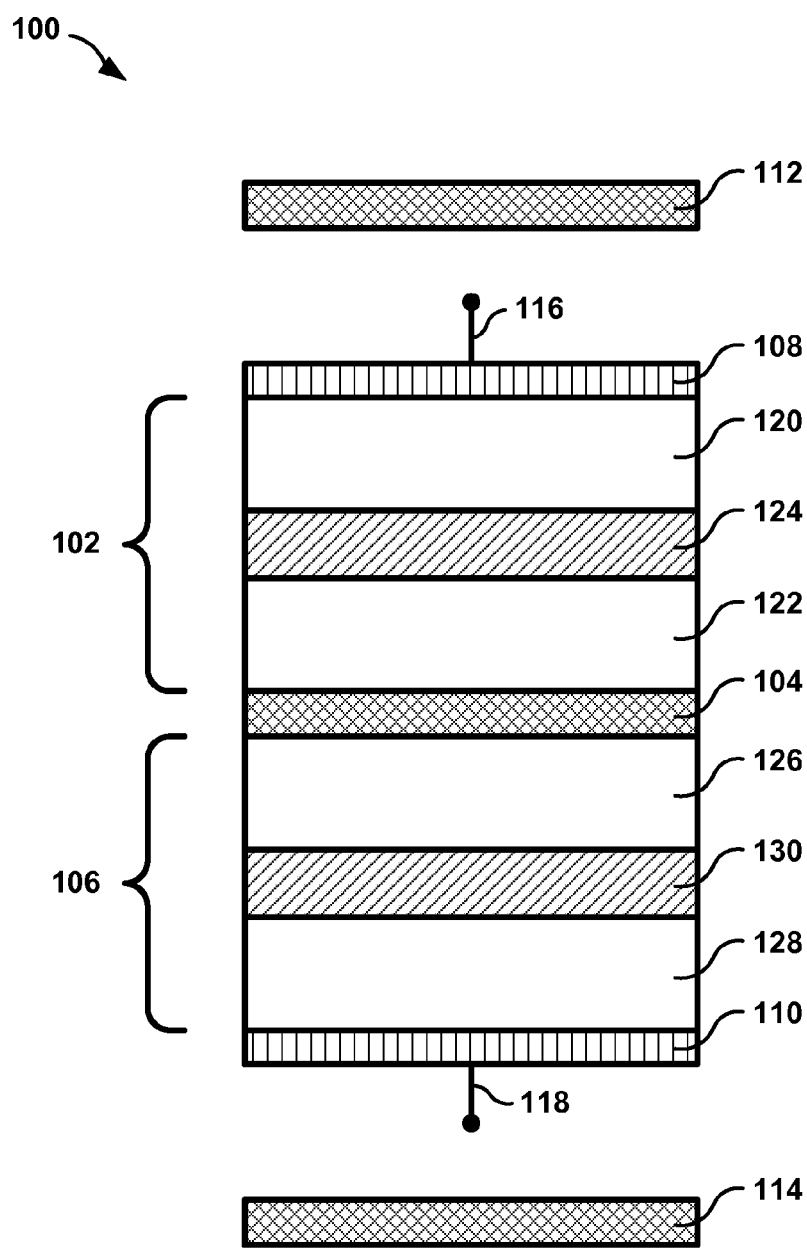
FIG. 5 is a conceptual diagram illustrating another example magnetoresistive device that may be used to implement the magnetoresistive device of FIG. 3 according to this disclosure.

FIG. 5 is a conceptual diagram illustrating another example magnetoresistive device 100 that may be used to implement the magnetoresistive device of FIG. 3 according to this disclosure. Magnetoresistive device 100 is an example of a toggle-bit magnetoresistive device. Magnetoresistive device 100 is configured to vary a terminal-to-terminal resistance based on a magnetization state of the magnetoresistive device. Magnetoresistive device 100 includes a free layer 102, a tunneling barrier layer 104, a fixed layer 106, electrodes 108, 110, 112, 114, and terminals 116, 118.

Similar to magnetoresistive device 70 illustrated in FIGS. 4A-4C, free layer 102 of magnetoresistive device 100 may be configured to have a magnetization direction that can be altered by the application of a magnetic field. Fixed layer 104 is configured to have a magnetization direction that is substantially fixed when the magnetic field is applied to free layer 102. Fixed layer 106 may alternatively be referred to as a pinned layer.

However, instead of free layer 102 and fixed layer 106 being composed of a single layer of ferromagnetic material as described above with respect to magnetoresistive device 70 in FIGS. 4A-4C, free layer 102 and fixed layer 106 in FIG. 5 may each comprise multi-layer structures that are formed from a plurality of sub-layers. For example, free layer 102 is a multi-layer structure formed from two ferromagnetic sub-layers 120, 122 with an anti-ferromagnetic coupling spacer sub-layer 124 disposed between the two ferromagnetic sub-layers 120, 122. Similarly, fixed layer 106 is a multi-layer structure formed from two ferromagnetic sub-layers 126, 128 with an anti-ferromagnetic coupling spacer sub-layer 130 disposed between the two ferromagnetic sub-layers 126, 128. In some examples, the multi-layer structures used to form free layer 102 and fixed layer 106 may be referred to as "synthetic anti-ferromagnetic (SAF) layer structures."

Ferromagnetic sub-layers 120, 122 may include, e.g., nickel (Ni), iron (Fe), cobalt (Co), or any combination thereof, including, e.g., binary and ternary alloys of Ni, Fe, and Co, permalloys, diluted magnetic alloys, or any other material that has ferromagnetic properties. Similarly, ferromagnetic sub-layers 126, 128 may include, e.g., Ni, Fe, Co, or any combination thereof, including, e.g., nickel alloys, iron alloys, cobalt alloys, permalloys, diluted alloys, or any other material that has ferromagnetic properties.

Each of anti-ferromagnetic coupling spacer sub-layers 124, 130 may include any material configured to produce anti-ferromagnetic coupling between the ferromagnetic layers adjacent to the respective anti-ferromagnetic coupling spacer sub-layer. For example, anti-ferromagnetic coupling spacer sub-layers 124, 130 may include ruthenium (Ru), manganese (Mn) alloys including binary alloys containing Mn, or combinations thereof.

The anti-ferromagnetic coupling of ferromagnetic layers, as used herein, refers to configuring of the ferromagnetic layers to have opposite magnetization directions or magnetic moments. For example, anti-ferromagnetic coupling spacer sub-layer 124 may be configured to anti-ferromagnetically couple ferromagnetic layers 120 and 122, and anti-ferromagnetic coupling spacer sub-layer 130 may be configured to anti-ferromagnetically couple ferromagnetic layers 126 and 128. Thus, during operation of magnetoresistive device 100, ferromagnetic layer 120 may be configured to have a magnetization direction opposite that of ferromagnetic layer 122. Similarly, ferromagnetic layer 126 may be configured to have a magnetization direction opposite that of ferromagnetic layer 128.

Ferromagnetic layers 120 and 122 may be constructed such that the magnitudes of the respective magnetic moment vectors for each of ferromagnetic layers 120 and 122 are not equal. For example, ferromagnetic layers 120 and 122 may each have a different thickness. Thus, even though the magnetic moments of ferromagnetic layers 120 and 122 may be oriented in opposite directions, a resultant magnetic moment for free layer 102 may take a specific direction, namely, the direction of the dominant magnetic moment vector between ferromagnetic layers 120 and 122. The resultant magnetic moment for free layer 102 may be referred to herein as the magnetization direction of free layer 102. Similar principles of construction may apply to ferromagnetic layers 126 and 128 producing a resultant magnetic moment for fixed layer 106 referred to herein as the magnetization direction for fixed layer 106.

In magnetoresistive device 100, tunneling barrier layer 104 is disposed between free layer 102 and fixed layer 106. Tunneling barrier layer 104 may include insulating materials, such as, e.g., aluminum oxide, magnesium oxide, other types of oxides, a nitride, or any other material having insulating properties.

The multi-layer structure formed by free layer 102, tunneling barrier layer 104 and fixed layer 106 may be disposed between electrodes 108, 110. As shown in FIG. 5, electrode 108 is proximate to free layer 102 and electrode 110 is proximate to fixed layer 106. In some examples, electrode 108 may be in direct contact with free layer 102 and electrode 110 may be in direct contact with fixed layer 106. Terminal 116 is electrically coupled to electrode 108, and terminal 118 is electrically coupled to electrode 110. As used herein, terminal 108 may be referred to as a "free layer terminal" and terminal 110 may be referred to as a "fixed layer terminal."

The magnetization state of magnetoresistive device 100, as used herein, may refer to whether the device is configured in a parallel magnetization state or an anti-parallel magnetization state. The magnetization state of magnetoresistive device 110 is defined by the relative orientation of the magnetization directions of free layer 102 and fixed layer 106. When the magnetization directions of free layer 102 and fixed layer 106 are aligned in the same direction, then magnetoresistive device 100 is said to be in a parallel magnetization state, alternatively referred to as a low resistance state. When the magnetization directions of free layer 102 and fixed layer 106 are oriented in opposite directions (i.e., not aligned in the same direction), then magnetoresistive device 100 is said to be in an anti-parallel magnetization state, alternatively referred to as a high resistance state.

Electrodes 112 and 114 may form respective write line electrodes for magnetoresistive device 100. Electrodes 112 and 114 may be configured to induce a magnetic field within free layer 102 when a write current is propagating through one or both of electrodes 112 and 114. In some examples, electrode 112 may be configured to propagate a write current in a direction that is substantially perpendicular to the direction in which electrode 114 is configured to propagate a write current. When currents are driven through electrodes 112 and 114 according to a toggle sequence, the timing and combination of magnetic fields induced by the currents may cause the magnetization direction of free layer 102 to toggle 180 degrees.

As shown in FIG. 5, electrode 112 is positioned proximate to free layer 102, and electrode 114 is positioned proximate to fixed layer 104. More specifically, electrode 112 is positioned on a side of electrode 108 opposite that of the multi-layer structure formed by free layer 102, tunneling barrier layer 104 and fixed layer 106. Similarly, electrode 114 is positioned on a side of electrode 110 opposite that of the multi-layer structure formed by free layer 102, tunneling barrier layer 104 and fixed layer 106. However, in further examples, electrodes 112 and 114 may each be positioned in any location where a magnetic field induced by a write current propagating through either of electrodes 112, 114 substantially overlaps with free layer 102. Electrode 112 may, in some examples, be electrically isolated from conductor 108 and/or free layer 102. For example, a dielectric may be applied to electrode 108, and electrode 112 may be formed on the side of the dielectric opposite that of electrode 108. Similarly, electrode 114 may, in some examples, be electrically isolated from conductor 110 and/or free layer 102. For example, a dielectric may be applied to electrode 114, and electrode 110 may be formed on the side of the dielectric opposite that of electrode 114.

In some examples, the toggle sequence may involve the following steps in the following order: (1) driving a first write current through a first write line electrode while not driving any write current through a second write line electrode; (2) driving the first write current through the first write line electrode while driving a second write current through the second write line electrode; (3) driving the second write current through the second write line electrode while not driving any write current through the first write line electrode; and (4) cease driving any write line currents through any write line electrodes. This particular sequence of driving the write line currents may be configured to toggle the magnetization state of magnetoresistive device 100. Further description of an example toggle-bit magnetoresistive device may be found in U.S. Pat. No. 6,545,906 to Savtchenko et al., which issued on Apr. 8, 2003 and is entitled, "METHOD OF WRITING TO SCALABLE MAGNETORESISTANCE RANDOM ACCESS MEMORY ELEMENT," and is incorporated herein by reference in its entirety.

In examples where magnetoresistive device 100 is used to implement magnetoresistive device 60 illustrated in FIG. 3, terminal 116 of magnetoresistive device 100 may correspond, in some examples, to terminal 62 of magnetoresistive device 60 and terminal 118 of magnetoresistive device 100 may correspond to terminal 64 of magnetoresistive device 60. In additional examples, terminal 118 of magnetoresistive device 100 may correspond to terminal 62 of magnetoresistive device 60 and terminal 116 of magnetoresistive device 100 may correspond to terminal 64 of magnetoresistive device 60.

Figure 6:
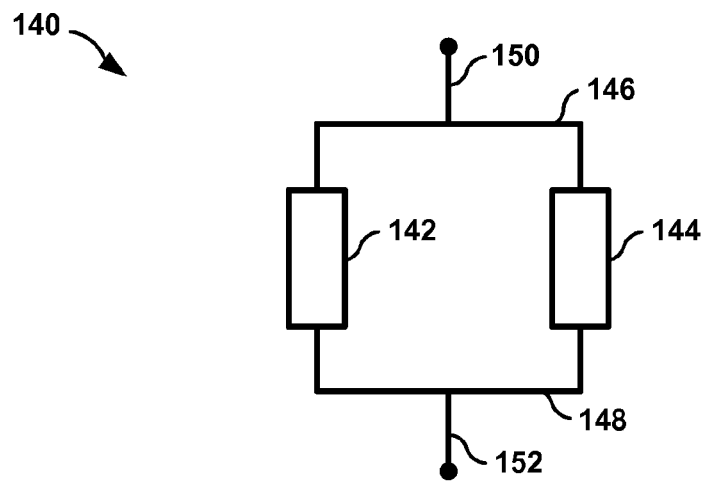
FIG. 6 is a schematic diagram of an example resistance network according to this disclosure.

FIG. 6 is a schematic diagram of an example resistance network 140 according to this disclosure. In some examples, resistance network 140 may correspond to the resistance network of write current source 16 discussed above with respect to FIG. 1 and/or to resistance network 36 discussed above with respect to FIG. 2.

Resistance network 140 includes a resistance 142 and a resistance 144. Resistance 142 includes a first terminal electrically coupled to node 146 and a second terminal electrically coupled to node 148. Resistance 144 includes a first terminal electrically coupled to node 146 and a second terminal electrically coupled to node 148. As such, resistance 142 is electrically coupled to resistance 144 in parallel. Because resistances 142 and 144 are electrically coupled in parallel, resistance network 140 may produce a non-linear resistance-temperature function as described herein.

Terminal 150 is electrically coupled to node 146 and terminal 152 is electrically coupled to node 148. In examples where resistance network 140 corresponds to resistance network 36 discussed above with respect to FIG. 2, terminal 150 may correspond to terminal 44 of resistance network 36 and terminal 152 may correspond to terminal 46 of resistance network 36.

In some examples, one or both of resistances 142 and 144 may comprise a magnetoresistive device. For example, if resistance 142 is implemented as magnetoresistive device 60 illustrated in FIG. 3, terminal 62 of magnetoresistive device 60 may be electrically coupled to node 146 and terminal 64 of magnetoresistive device 60 may be electrically coupled to node 148. Any remaining resistors that are not magnetoresistive devices within resistance network 140 may represent discrete or parasitic resistances. In some examples, the discrete resistances may be silicon resistances.

Figure 7:
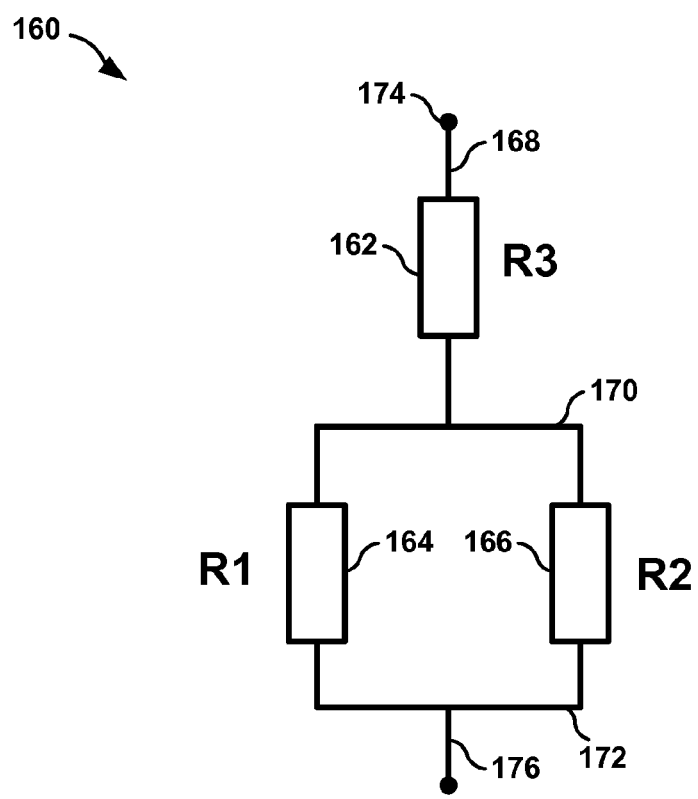
FIG. 7 is a schematic diagram of another example resistance network according to this disclosure.

FIG. 7 is a schematic diagram of another example resistance network 160 according to this disclosure. In some examples, resistance network 160 may correspond to the resistance network of write current source 16 discussed above with respect to FIG. 1 and/or to resistance network 36 discussed above with respect to FIG. 2.

Resistance network 160 includes a resistance 162, a resistance 164, and a resistance 166. Resistance 162 includes a first terminal electrically coupled to node 168 and a second terminal electrically coupled to node 170. Resistance 164 includes a first terminal electrically coupled to node 170 and a second terminal electrically coupled to node 172. Resistance 166 includes a first terminal electrically coupled to node 170 and a second terminal electrically coupled to node 172. As such, resistance 164 is electrically coupled to resistance 166 in parallel. Because resistances 164 and 166 are electrically coupled in parallel, resistance network 160 may produce a non-linear resistance-temperature function as described herein.

Resistances 164 and 166 may form a parallel resistance sub-network. Node 170 may form a first terminal of the parallel resistance sub-network and node 172 may form a second terminal of the parallel resistance sub-network. Resistance 162 may be electrically coupled in series to the first terminal of the parallel resistance sub-network.

Terminal 174 is electrically coupled to node 168 and terminal 176 is electrically coupled to node 172. In examples where resistance network 160 corresponds to resistance network 36 discussed above with respect to FIG. 2, terminal 174 may correspond, in some examples, to terminal 44 of resistance network 36 and terminal 176 may correspond to terminal 46 of resistance network 36. In further examples, terminal 176 may correspond to terminal 44 of resistance network 36 and terminal 174 may correspond to terminal 46 of resistance network 36.

In some examples, one or more of resistances 162, 164 and 166 may comprise a magnetoresistive device. For example, if resistance 164 is implemented as magnetoresistive device 60 illustrated in FIG. 3, terminal 62 of magnetoresistive device 60 may be electrically coupled to node 170 and terminal 64 of magnetoresistive device 60 may be electrically coupled to node 172. As another example, if resistance 162 is implemented as magnetoresistive device 60 illustrated in FIG. 3, terminal 62 of magnetoresistive device 60 may be electrically coupled to node 168 and terminal 64 of magnetoresistive device 60 may be electrically coupled to node 170. Any remaining resistors that are not magnetoresistive devices within resistance network 160 may represent discrete or parasitic resistances. In some examples, the discrete resistances may be silicon resistances.

As shown in FIG. 7 resistance 162 may have a resistance value of R1, resistance 164 may have a resistance value of R2, and resistance 166 may have a resistance value of R3. The equivalent resistance ($R_{EQ}$) between terminals 174 and 176 may be written according to the following equation:

$$R_{EQ} = R3 + \frac{R1 \cdot R2}{R1 + R2} \quad (1)$$

Equation (1) may be re-written as the following equation:

$$R_{EQ} = R3 + \frac{R1}{1 + \frac{R1}{R2}} \quad (2)$$

As shown in Equation (2), if R2 is much larger than R1 (i.e., R2>>R1), then $R_{EQ}$ can be approximated by (R3+R1). A similar manipulation can be used to show that if R1 is much larger than R2 (i.e., R1>>R2), then $R_{EQ}$ can be approximated by (R3+R2). In this manner, the resistance can be adjusted between two limiting values.

Figure 8:
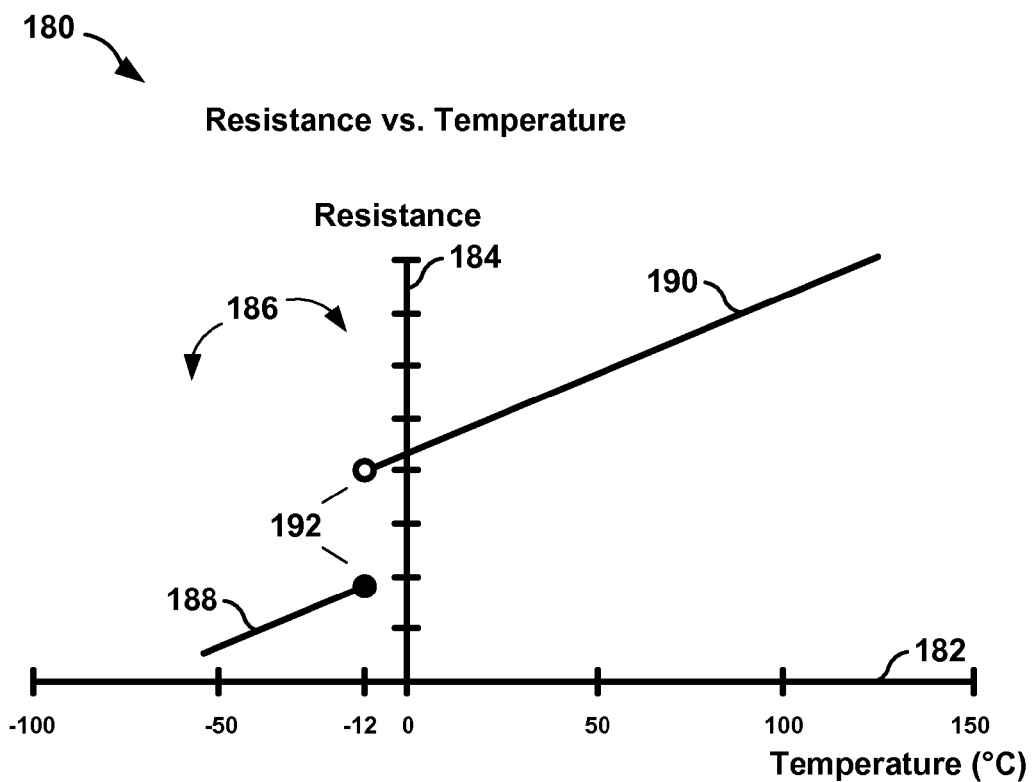
FIG. 8 is a diagram illustrating an example piecewise linear resistance-temperature function according to this disclosure.

FIG. 8 is a diagram 180 illustrating an example piecewise linear resistance-temperature function according to this disclosure. Diagram 180 includes axes 182, 184 and resistance-temperature function 186. Axis 182 represents temperature in degrees Celsius (C) increasing from left to right. Axis 184 represents resistance increasing from bottom to top. Resistance-temperature function 186 is a description of a resistance-response for a resistance network that varies as a function of temperature. It should be noted that resistance-temperature function may vary according to one or more other variables in addition to temperature.

Resistance-temperature function 186 includes linear portions 188, 190 and a discontinuity 192 formed between the two linear portions 188, 190. In some examples, a discontinuity may refer to a point in the interior of the function where the values of the right-hand and left-hand limits approaching the point are different. A point in the interior of the function may refer to all points for which the function is defined excluding the endpoints of the function. A linear portion of a function may have a substantially constant slope as the temperature varies through the points covered by the linear portion. Because resistance-temperature function 186 includes two or more linear portions and one or more discontinuities, resistance-temperature function 186 may be referred to herein as a piece-wise linear temperature function.

Resistance-temperature function 186 shown in FIG. 8 may correspond to a resistance-temperature function produced by a resistance network according to this disclosure that includes a single magnetoresistive device having a positive temperature coefficient. The positive slopes of linear portions 188, 190 represent the positive temperature coefficient. As shown in FIG. 8, discontinuity 192 occurs at −12 degrees C., which may correspond to the threshold operating temperature discussed above with respect to FIG. 1. When the operating temperature is below the threshold operating temperature, the magnetoresistive device is switched into a low resistance state, which may cause the write current source to provide an increased magnitude of write current. When the operating temperature is above the threshold operating temperature, the magnetoresistive device is switched into a high resistance state, which may cause the write current source to provide a decreased magnitude of write current.

Figure 9:
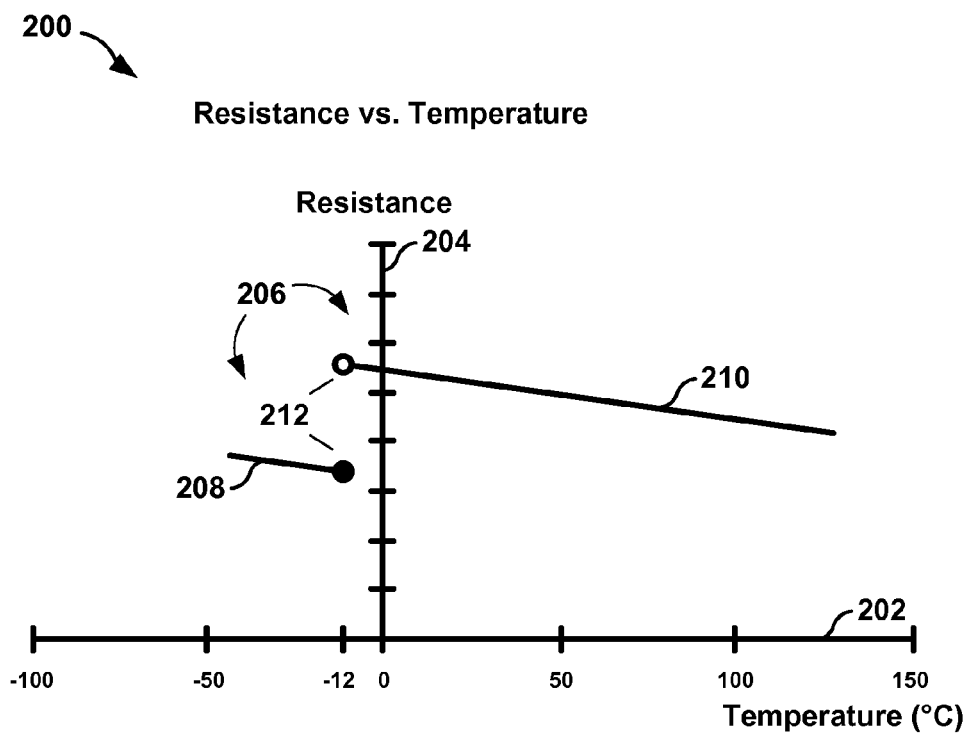
FIG. 9 is a diagram illustrating another example piecewise linear resistance-temperature function according to this disclosure.

FIG. 9 is a diagram 200 illustrating an example piecewise linear resistance-temperature function according to this disclosure. Diagram 200 includes axes 202 and 204, which are similar to axes 182 and 184, respectively, already described above with respect to FIG. 8. Diagram 200 also includes resistance-temperature function 206 that includes linear portions 208, 210 and a discontinuity 212 formed between the two linear portions 208, 210. Because resistance-temperature function 186 includes two or more linear portions and one or more discontinuities, resistance-temperature function 186 may be referred to herein as a piece-wise linear temperature function.

Resistance-temperature function 206 is similar to resistance-temperature function 186 illustrated in FIG. 8 except that linear portions 208 and 210 are negatively sloping. Thus, resistance-temperature function 206 shown in FIG. 9 may correspond to a resistance network that includes a single magnetoresistive device having a negative temperature coefficient. As shown in FIG. 9, discontinuity 212 occurs at −12 degrees C., which may correspond to the threshold operating temperature discussed above with respect to FIG. 1. When the operating temperature is below the threshold operating temperature, the magnetoresistive device is switched into a low resistance state, which may cause the write current source to provide an increased magnitude of write current at temperatures proximate to the threshold operating temperature. When the operating temperature is above the threshold operating temperature, the magnetoresistive device is switched into a high resistance state, which may cause the write current source to provide a decreased magnitude of write current at temperatures proximate to the threshold operating temperature.

Figure 10:
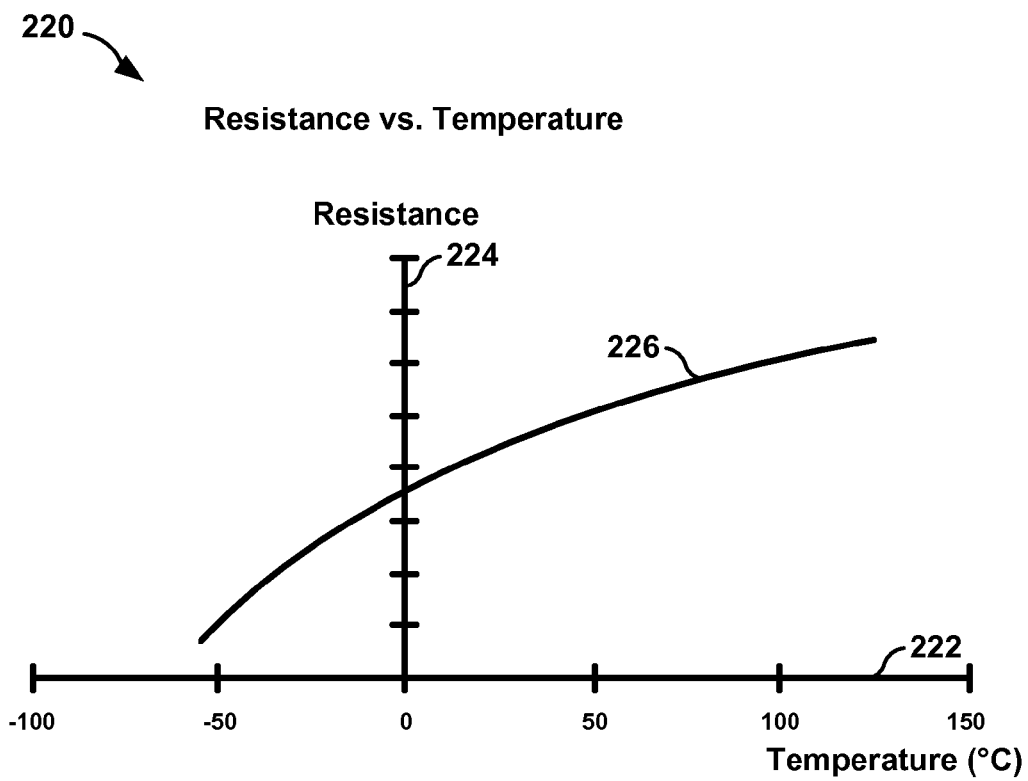
FIG. 10 is a diagram illustrating an example non-linear resistance-temperature function according to this disclosure.

FIG. 10 is a diagram 220 illustrating an example non-linear resistance-temperature function according to this disclosure.

Diagram 220 includes axes 222 and 224, which are similar to axes 182 and 184, respectively, already described above with respect to FIG. 8. Diagram 220 also includes resistance-temperature function 226. Because resistance-temperature function 226 includes a slope that varies as a function of temperature (i.e., a slope that is not substantially constant across the temperature range), resistance-temperature function 226 may be referred to herein as a non-linear resistance-temperature function.

Resistance-temperature function 226 shown in FIG. 10 may correspond to a resistance-temperature function produced by a resistance network according to this disclosure that includes a parallel network of resistances, such as, e.g., resistance network 140 illustrated in FIG. 6 and/or resistance network 160 illustrated in FIG. 7. The parallel resistance network may produce a net temperature coefficient for the parallel resistance network that non-linearly varies with temperature. Although FIG. 10 illustrates an example resistance-temperature function 226 that is oriented in a concave-down fashion, in other examples, a resistance network may be configured to produce a resistance-temperature function where some or all of the function is oriented in a concave-up fashion.

Figure 11:
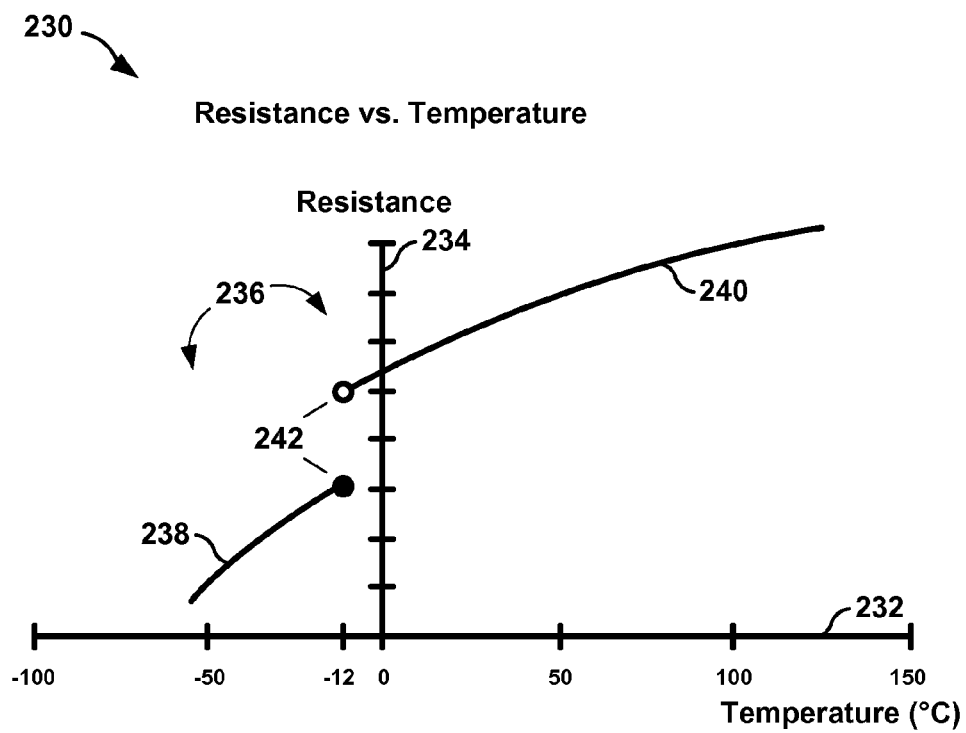
FIG. 11 is a diagram illustrating an example non-linear resistance-temperature function that includes at least one discontinuity according to this disclosure.

FIG. 11 is a diagram 230 illustrating an example non-linear resistance-temperature function that includes at least one discontinuity according to this disclosure. Diagram 230 includes axes 232 and 234, which are similar to axes 182 and 184, respectively, already described above with respect to FIG. 8. Diagram 230 also includes resistance-temperature function 236 that includes non-linear portions 238, 240 and a discontinuity 242 formed between the two non-linear portions 238, 240. A non-linear portion of a function may have a slope that varies (i.e., is not substantially constant) through the points covered by the non-linear portion. Because resistance-temperature function 236 includes two or more non-linear portions and one or more discontinuities, resistance-temperature function 236 may be referred to herein as a piece-wise non-linear temperature function.

Resistance-temperature function 236 shown in FIG. 11 may correspond to a resistance-temperature function produced by a resistance network according to this disclosure that includes a parallel network of resistances where at least one of the resistances is a magnetoresistive device. The parallel resistance network may correspond to, e.g., resistance network 140 illustrated in FIG. 6 and/or resistance network 160 illustrated in FIG. 7. The positive slopes of non-linear portions 238, 240 represent that the net temperature coefficient of the resistance network is positive. As shown in FIG. 11, discontinuity 242 occurs at −12 degrees C., which may correspond to the threshold operating temperature discussed above with respect to FIG. 1. When the operating temperature is below the threshold operating temperature, the magnetoresistive device is switched into a low resistance state, which may cause the write current source to provide an increased magnitude of write current. When the operating temperature is above the threshold operating temperature, the magnetoresistive device is switched into a high resistance state, which may cause the write current source to provide a decreased magnitude of write current.

Figure 12:
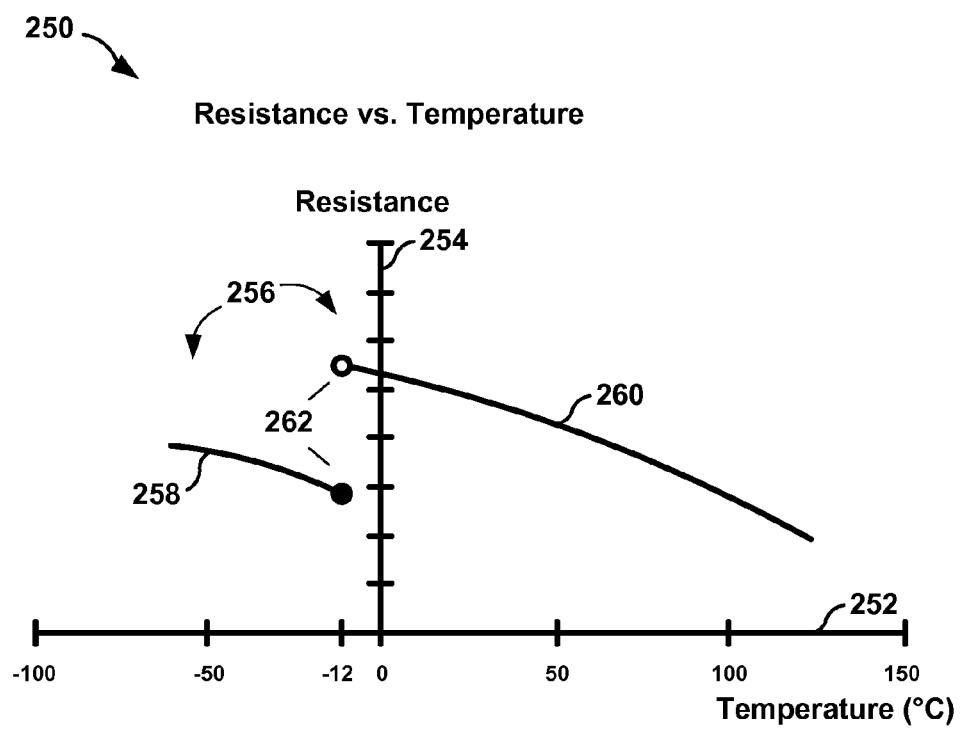
FIG. 12 is a diagram illustrating another example non-linear resistance-temperature function that includes at least one discontinuity according to this disclosure.

FIG. 12 is a diagram 250 illustrating another example non-linear resistance-temperature function that includes at least one discontinuity according to this disclosure. Diagram 250 includes axes 252 and 254, which are similar to axes 182 and 184, respectively, already described above with respect to FIG. 8. Diagram 250 also includes resistance-temperature function 256 that includes non-linear portions 258, 260 and a discontinuity 262 formed between the two non-linear portions 258, 260. Because resistance-temperature function 256 includes two or more non-linear portions and one or more discontinuities, resistance-temperature function 256 may be referred to herein as a piece-wise non-linear temperature function.

Resistance-temperature function 256 is similar to resistance-temperature function 236 illustrated in FIG. 11 except that non-linear portions 258 and 260 are negatively sloping. Thus, similar to FIG. 11, resistance-temperature function 256 shown in FIG. 12 may correspond to a resistance network that includes a parallel network of resistances where at least one of the resistances is a magnetoresistive device. However, the negative slopes of non-linear portions 258, 260 represent that the net temperature coefficient of the resistance network is negative. When the operating temperature is below the threshold operating temperature, the magnetoresistive device is switched into a low resistance state, which may cause the write current source to provide an increased magnitude of write current at temperatures proximate to the threshold operating temperature. When the operating temperature is above the threshold operating temperature, the magnetoresistive device is switched into a high resistance state, which may cause the write current source to provide a decreased magnitude of write current at temperatures proximate to the threshold operating temperature.

The conceptual diagrams in FIGS. 8-12 are provided merely to depict general concepts of this disclosure, such as, e.g., resistance-temperature functions that have discontinuities, non-linear resistance-temperature functions, piece-wise linear resistance-temperature functions, piece-wise non-linear resistance-temperature functions, positive temperature coefficients and/or negative temperature coefficients. As such, it is understood that these conceptual diagrams are not necessarily intended to be mathematically rigorous depictions of resistance-temperature functions that may occur using the techniques of this disclosure. Moreover, these conceptual diagrams are not intended to be exhaustive of the different types of resistance-temperature functions that may be able to be produced according to certain aspects of this disclosure. Other types of resistance-temperature functions are also contemplated, such as, e.g., resistance-temperature functions that have different slopes, resistance-temperature functions that have different curvatures and/or resistance-temperature functions that have discontinuities at one or more threshold temperatures in addition to or in lieu of the −12 degrees C. threshold operating temperature illustrated in FIGS. 8-12.

Figure 13:
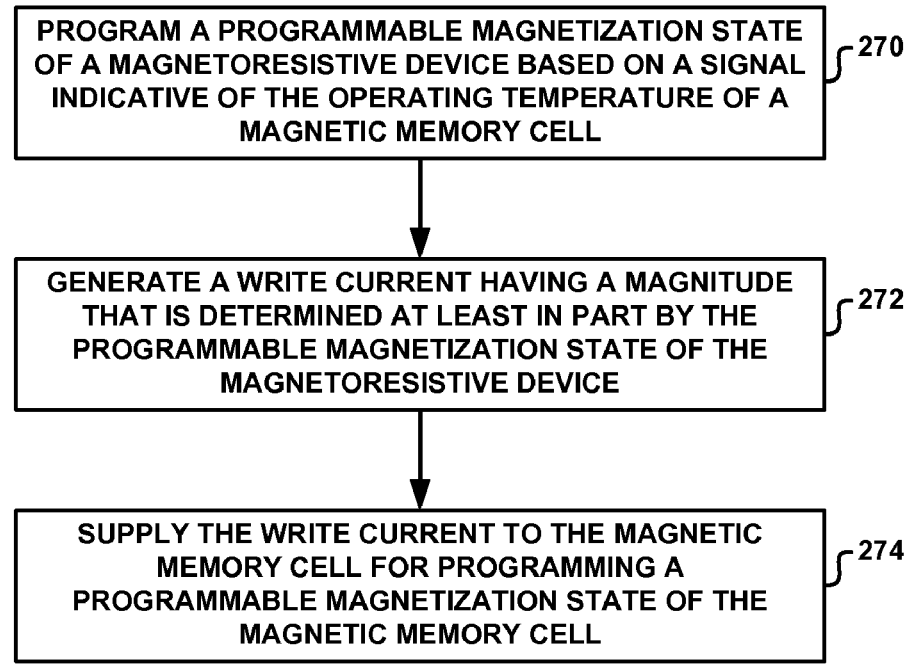
FIG. 13 is a flow diagram illustrating an example technique for generating a temperature-compensated write current according to this disclosure.

FIG. 13 is a flow diagram illustrating an example technique for generating a temperature-compensated write current according to this disclosure. In some examples, the technique in FIG. 13 may be used in data storage device 10 illustrated in FIG. 1.

In the example of FIG. 13, control module 14 programs a programmable magnetization state of a magnetoresistive device contained within a resistance network of a write current source 16 based on a signal indicative of the operating temperature of a magnetic memory cell 18 (270). Write current source 16 generates a write current having a magnitude that is determined at least in part by the programmable magnetization state of the magnetoresistive device (272). Write current source 16 supplies the write current to the magnetic memory cell for programming a programmable magnetization state of the magnetic memory cell (274).

Figure 14:
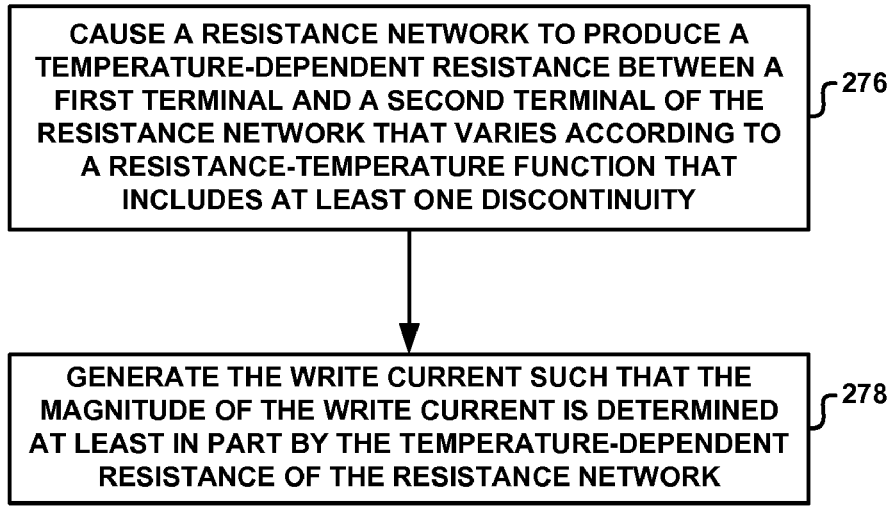
FIG. 14 is a flow diagram illustrating another example technique for generating a temperature-compensated write current according to this disclosure.

FIG. 14 is a flow diagram illustrating another example technique for generating a temperature-compensated write current according to this disclosure. In some examples, the techniques in FIG. 14 may be used to implement process box 272 discussed above with respect to FIG. 13.

In the example of FIG. 14, control module 14 causes the resistance network within write current source 16 to produce a temperature-dependent resistance between a first terminal and a second terminal of the resistance network that varies according to a resistance-temperature function that includes at least one discontinuity (276). Write current source 16 generates the write current such that the magnitude of the write current is determined at least in part by the temperature-dependent resistance of the resistance network (278).

The techniques in this disclosure may be used to provide temperature compensation for write and read applications in MRAM magnetic devices. MRAM parts, such as, e.g., high density MRAM parts that operate across wider temperature ranges, may use temperature compensation to match electronic response to magnetic bit behavior. In some examples, the techniques may allow for a customized temperature compensation approach to optimize performance and extend temperature range of such devices. The techniques in this disclosure may also allow for a programmable temperature compensation technique that may be programmed during operation of the device.

The techniques in this disclosure may provide non-linear and/or piecewise-linear temperature compensation. Such compensation techniques may be used to optimize write and read performance including extending temperature range. In addition, the techniques may also support flexibility in order to improve performance such as biases, write currents, and error rates. For example, a resistance network that produces a temperature-dependent resistance according to a temperature-resistance function that has breakpoints, quadratic, and/or higher-order terms can be used to optimize biases, write currents, and error rates. Timing can also be used to select the chosen response implemented by device response, logic, or other means. In some examples, the techniques in this disclosure may also use feedback-based current mirrors that incorporate a resistance network according to this disclosure.

The techniques described herein may be able to produce integrated circuits having lower power consumption and/or increased chip density in comparison to integrated circuits that implement equivalent logic using a CMOS process technology. In contrast to transistor-based CMOS logic gates, the magnetic logic gates designed in accordance with this disclosure may be non-volatile, i.e., such gates may retain their state even if the logic gate is not receiving power. In addition, the techniques in this disclosure may be able to be monolithically integrated with conventional CMOS electronics.

The circuit components described in this disclosure can be implemented as discrete components, as one or more integrated devices, or any combination thereof. The circuit components described herein may be fabricated using any of a wide variety of process technologies including CMOS process technologies. In addition, the circuitry described herein may be used in various applications including telecommunications applications, general computing application, or any application that utilizes a clock generation and distribution system.

Various aspects of the disclosure have been described. These and other aspects are within the scope of the following claims.

The invention claimed is:

1. A device comprising:
   a magnetic memory cell having a programmable magnetization state;
   a write current source comprising a resistance network that includes a magnetoresistive device having a programmable magnetization state, the write current source being configured to generate a write current having a magnitude that is determined at least in part by the programmable magnetization state of the magnetoresistive device, and to supply the write current to the magnetic memory cell for programming the programmable magnetization state of the magnetic memory cell; and
a control module configured to program the programmable magnetization state of the magnetoresistive device based on a signal indicative of an operating temperature of the magnetic memory cell.

2. The device of claim 1, wherein the control module is further configured to switch the magnetization state of the magnetoresistive device based on the signal indicative of the operating temperature of the magnetic memory cell to cause the resistance network to produce a temperature-dependent resistance between a first terminal and a second terminal of the resistance network that varies according to a resistance-temperature function that includes at least one discontinuity, the write current source being further configured to generate the write current such that the magnitude of the write current is determined at least in part by the temperature-dependent resistance of the resistance network.

3. The device of claim 2, wherein the resistance network is further configured to cause the resistance-temperature function to be a non-linear function that includes the at least one discontinuity.

4. The device of claim 1, wherein the resistance network further comprises a first resistance electrically coupled in parallel to the magnetoresistive device.

5. The device of claim 4,
wherein the first resistance and the magnetoresistive device form a parallel resistance sub-network; and
wherein the resistance network further comprises a second resistance electrically coupled in series to the parallel resistance sub-network.

6. The device of claim 1, wherein the resistance network further comprises:
a first resistance;
a second resistance electrically coupled in parallel to the first resistance, the first and second resistances forming a parallel resistance sub-network,
wherein the magnetoresistive device is electrically coupled in series with the parallel resistance sub-network.

7. The device of claim 1, wherein the write current source further comprises:
a first transistor comprising a base terminal and a drain terminal, the base terminal being electrically coupled to the drain terminal, the drain terminal being electrically coupled to the resistance network; and
a second transistor comprising a base terminal and a drain terminal, the base terminal of the second transistor being electrically coupled to the base terminal of the first transistor, the drain terminal of the second transistor being electrically coupled to the magnetic memory cell and configured to provide the write current to the magnetic memory cell.

8. The device of claim 1, wherein the magnetic memory cell comprises a toggle-bit magnetic random access memory (MRAM) cell.

9. The device of claim 1, wherein the magnetoresistive device comprises a magnetic tunnel junction (MTJ) magnetoresistive device.

10. The device of claim 1, further comprising:
a sensing module configured to generate the signal indicative of the operating temperature of the magnetic memory cell.

11. A method comprising:
programming a programmable magnetization state of a magnetoresistive device included within a resistance network based on a signal indicative of an operating temperature of a magnetic memory cell;
generating a write current having a magnitude that is determined at least in part by the programmable magnetization state of the magnetoresistive device; and
supplying the write current to the magnetic memory cell for programming a programmable magnetization state of the magnetic memory cell.

12. The method of claim 11, wherein generating the write current comprises:
switching the magnetization state of the magnetoresistive device based on the signal indicative of the operating temperature of the magnetic memory cell to cause the resistance network to produce a temperature-dependent resistance between a first terminal and a second terminal of the resistance network that varies according to a resistance-temperature function that includes at least one discontinuity; and
generating the write current such that the magnitude of the write current is determined at least in part by the temperature-dependent resistance of the resistance network.

13. The method of claim 12, further comprising:
causing the resistance-temperature function to be a non-linear function that includes the at least one discontinuity.

14. The method of claim 11, wherein the resistance network further comprises a first resistance electrically coupled in parallel to the magnetoresistive device.

15. The method of claim 14,
wherein the first resistance and the magnetoresistive device form a parallel resistance sub-network; and
wherein the resistance network further comprises a second resistance electrically coupled in series to the parallel resistance sub-network.

16. The method of claim 11, wherein the resistance network further comprises:
a first resistance;
a second resistance electrically coupled in parallel to the first resistance, the first and second resistances forming a parallel resistance sub-network,
wherein the magnetoresistive device is electrically coupled in series with the parallel resistance sub-network.

17. The method of claim 11, wherein the magnetic memory cell comprises a toggle-bit magnetic random access memory (MRAM) cell.

18. The method of claim 11, wherein the magnetoresistive device comprises a magnetic tunnel junction (MTJ) magnetoresistive device.

19. The method of claim 11, further comprising:
generating the signal indicative of the operating temperature of the magnetic memory cell.

20. An apparatus comprising:
means for programming a programmable magnetization state of a magnetoresistive device included within a resistance network based on a signal indicative of an operating temperature of a magnetic memory cell;
means for generating a write current having a magnitude that is determined at least in part by the programmable magnetization state of the magnetoresistive device; and
means for supplying the write current to the magnetic memory cell for programming a programmable magnetization state of the magnetic memory cell.

* * * * *